United States Patent
Judy et al.

(10) Patent No.: US 11,943,907 B2
(45) Date of Patent: Mar. 26, 2024

(54) RF-SHIELDED WINDOW APPARATUS AND METHOD OF MANUFACTURING SAME

(71) Applicant: Merakai, LLC, Santa Barbara, CA (US)

(72) Inventors: Ryan Judy, Santa Barbara, CA (US); Joseph Schwartz, Santa Barbara, CA (US)

(73) Assignee: Merakai, LLC, Santa Barbara, CA (US)

( * ) Notice: Subject to any disclaimer, the term of this patent is extended or adjusted under 35 U.S.C. 154(b) by 0 days.

(21) Appl. No.: 18/282,198

(22) PCT Filed: Mar. 16, 2022

(86) PCT No.: PCT/US2022/020655
§ 371 (c)(1),
(2) Date: Sep. 14, 2023

(87) PCT Pub. No.: WO2022/197873
PCT Pub. Date: Sep. 22, 2022

(65) Prior Publication Data
US 2024/0040761 A1 Feb. 1, 2024

Related U.S. Application Data

(60) Provisional application No. 63/161,942, filed on Mar. 16, 2021.

(51) Int. Cl.
*H05K 9/00* (2006.01)

(52) U.S. Cl.
CPC ........ *H05K 9/0094* (2013.01); *H05K 9/0005* (2013.01); *H05K 9/0015* (2013.01); *H05K 9/009* (2013.01)

(58) Field of Classification Search
CPC ..................................................... H09K 9/0005
See application file for complete search history.

(56) References Cited

U.S. PATENT DOCUMENTS

| | | | | |
|---|---|---|---|---|
| 5,012,041 A | * | 4/1991 | Sims | .......................... E06B 5/18 174/381 |
| 5,147,694 A | * | 9/1992 | Clarke | .................... B32B 27/08 428/192 |
| 9,497,894 B1 | | 11/2016 | Ramsey | |

(Continued)

*Primary Examiner* — Hung V Ngo
(74) *Attorney, Agent, or Firm* — Lance M. Pritikin

(57) ABSTRACT

An RF-shielded window apparatus may include a primary panel and a secondary panel. The primary panel may include a primary RF shield layer disposed between a primary backing substrate and a protective layer. The secondary panel may include a secondary backing substrate and a secondary RF shield layer. The first panel element and the second panel element may be secured to one another such that the primary RF shield layer, the secondary RF shield layer and the protective layer are collectively disposed between the primary backing substrate and the secondary backing substrate. The primary RF shield layer and the secondary RF shield layer may be in electrically-conductive communication with one another. A panel joining strip may help secure the first panel to the second panel, and the electrically-conductive communication may be at least in part by way of the panel joining strip. Associated manufacturing methods are also disclosed.

18 Claims, 24 Drawing Sheets

(56) References Cited

U.S. PATENT DOCUMENTS

| | | | |
|---|---|---|---|
| 2006/0254815 A1 | 11/2006 | Humphrey et al. | |
| 2007/0045470 A1* | 3/2007 | Guidon | H05K 9/0005 |
| | | | 244/129.3 |
| 2012/0201011 A1* | 8/2012 | Finley | H05K 9/0054 |
| | | | 361/818 |
| 2014/0097018 A1* | 4/2014 | Russell | B32B 37/18 |
| | | | 156/107 |
| 2015/0060129 A1 | 3/2015 | Judy et al. | |
| 2015/0060603 A1* | 3/2015 | Yokoi | E06B 5/18 |
| | | | 49/463 |
| 2015/0197327 A1 | 7/2015 | Eberle et al. | |
| 2020/0396822 A1* | 12/2020 | Ting | H05K 9/0094 |
| 2021/0045270 A1* | 2/2021 | Grosse | H05K 9/0086 |

\* cited by examiner

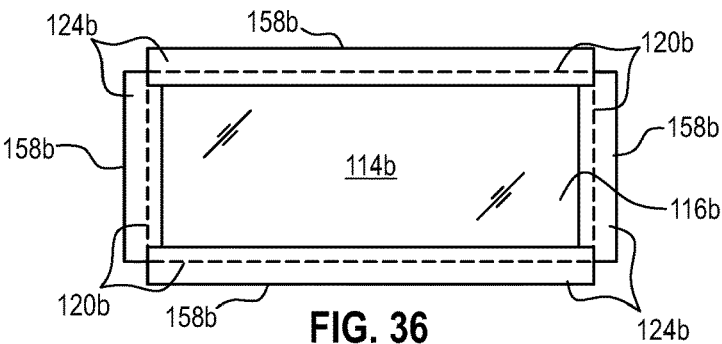
FIG. 36
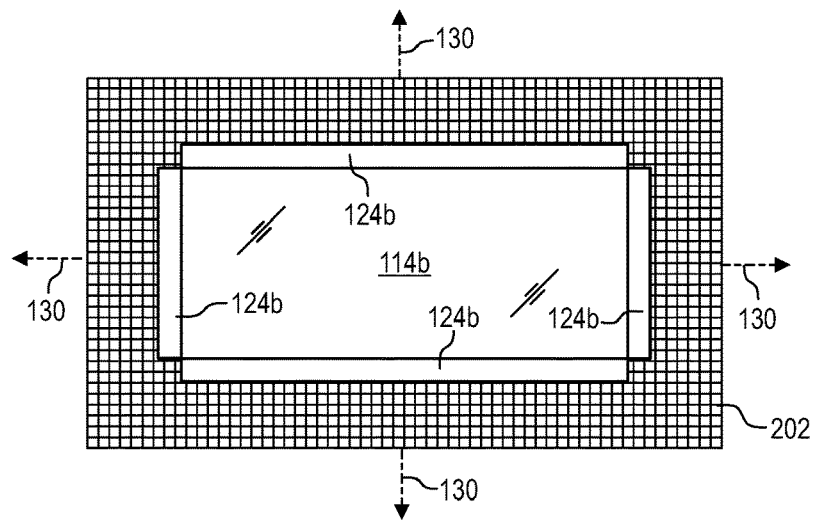
FIG. 37
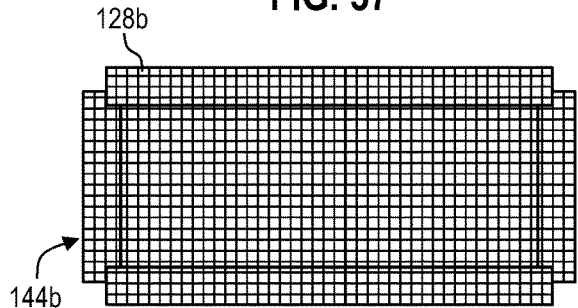
FIG. 38
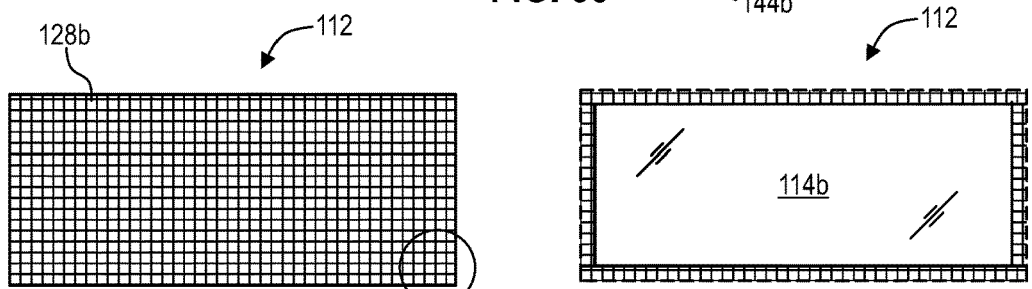
FIG. 39
FIG. 40
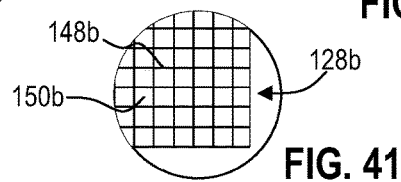
FIG. 41

RF-SHIELDED WINDOW APPARATUS AND METHOD OF MANUFACTURING SAME

RELATED APPLICATIONS

This application is a U.S. national stage of PCT International Patent Application No. PCT/US2022/020655 having an international filing date of Mar. 16, 2022, which claims the benefit of U.S. Provisional Application No. 63/161,942 filed Mar. 16, 2021. The contents of the above-identified applications are incorporated by this reference in their entireties for all purposes as if fully set forth herein.

TECHNICAL FIELD

The present disclosure relates generally to the field of radio frequency (RF) shielded enclosures. More particularly, the present disclosure relates to transparent window structures for use in radio frequency (RF) shielded enclosures.

BACKGROUND

In the past, RF shielded windows might have used materials with characteristics that offer lower clarity with high RF shielding, or higher clarity with lower RF shielding. It may have been difficult to achieve characteristics that provide for high RF shielding and high clarity at the same time, as well as a window that does not become blemished over time throughout usage.

What is needed is an improved transparent, radio-frequency shielded window that offers a significantly higher level of clarity than previous radio-frequency shielding windows, while maintaining a high level of RF attenuation.

SUMMARY

Certain deficiencies of the prior art may be overcome by the provision of an RF-shielded window apparatus, and method of manufacturing same, in accordance with the present disclosure.

The window apparatus may be used in applications such as viewing an object behind the window, for example a cell phone screen, while also maintaining a high level or RF attenuation of that object. The window apparatus could be installed in an RF shielding enclosure, such as a faraday box, or may be used in other applications such as in RF shielding rooms, labs, tents, or anywhere where clarity and RF shielding may be desired. The disclosed window apparatus involves a combination and configuration of materials that accomplish high clarity, high shielding, and long-term durability, as well as a method of manufacturing same.

BRIEF DESCRIPTION OF THE DRAWINGS

Further advantages of the present invention may become apparent to those skilled in the art with the benefit of the following detailed description of the preferred embodiments and upon reference to the accompanying drawings in which:

FIG. 36 is a diagrammatic top view corresponding to the configuration shown in FIG. 15;

FIG. 37 is a diagrammatic top view corresponding to the configuration shown in FIG. 17;

FIG. 38 is a diagrammatic bottom view corresponding to the configuration shown in FIG. 20;

FIG. 39 is a diagrammatic bottom view corresponding to the configuration shown in FIG. 21;

FIG. 40 is a diagrammatic top view corresponding to the configuration shown in FIG. 21;

FIG. 41 is a magnified view of detail 41 in FIG. 39;

DETAILED DESCRIPTION OF THE PREFERRED EMBODIMENTS

Figure 1:
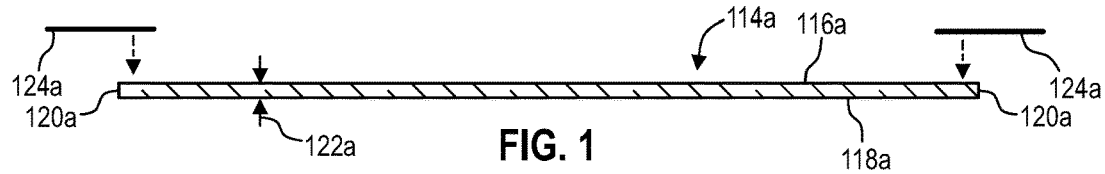
FIGS. 1-13 are cross-sectional views diagrammatically illustrating an example sequence of steps for manufacturing a primary panel element for use in constructing an RF-shielded window apparatus.

Referring now to the drawings, like reference numerals designate identical or corresponding features throughout the several views.

Various exemplary implementations of an RF-shielded window apparatus in accordance with the present disclosure are shown generally at 100 in the several drawings presented herewith.

Figure 6:
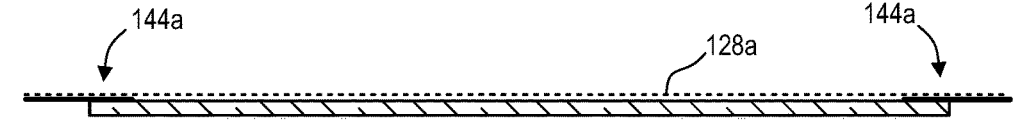
Figure 7:
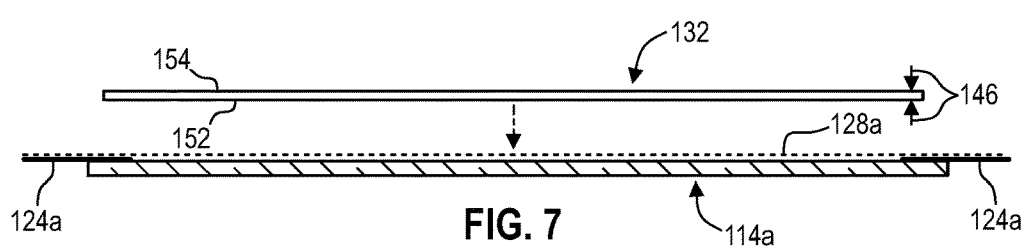
Figure 12:
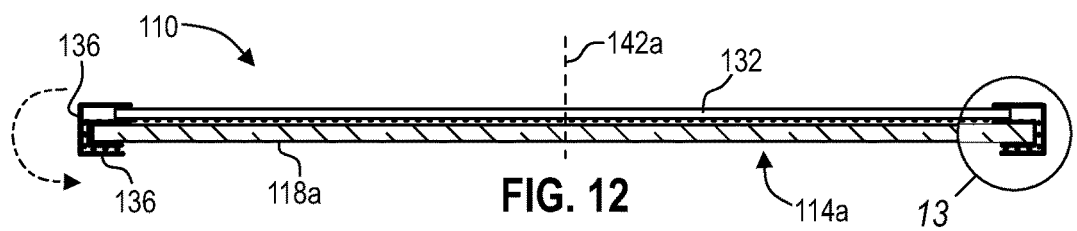
Figure 13:
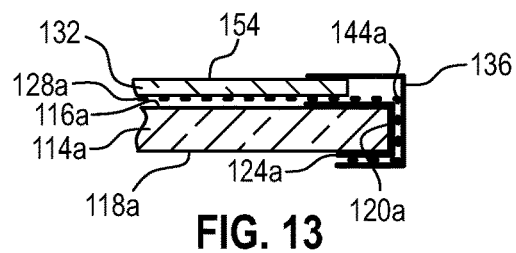
Figure 25:
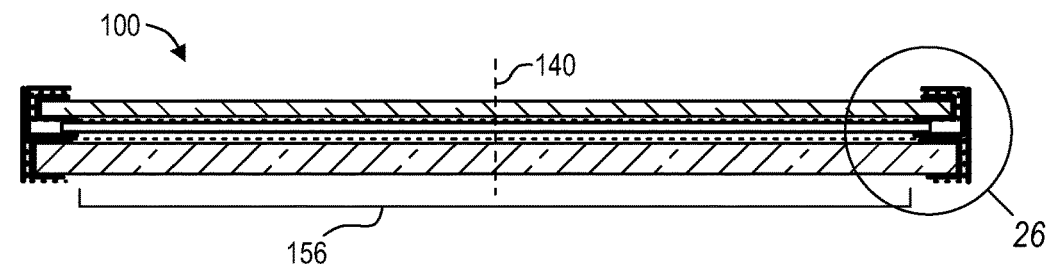
Figure 26:
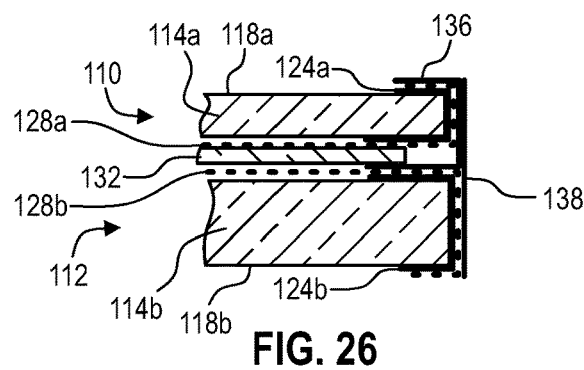
Figure 29:
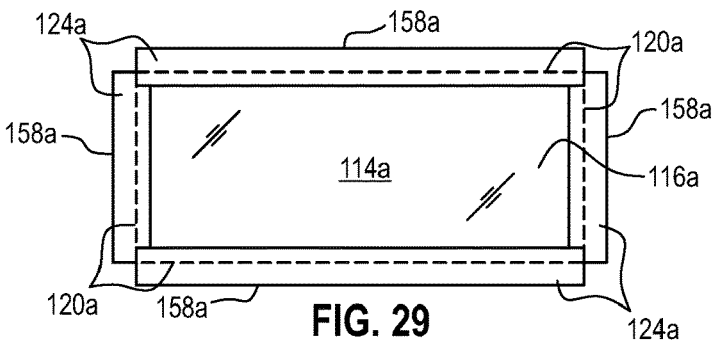
FIG. 29 is a diagrammatic top view corresponding to the configuration shown in FIG. 2.
Figure 30:
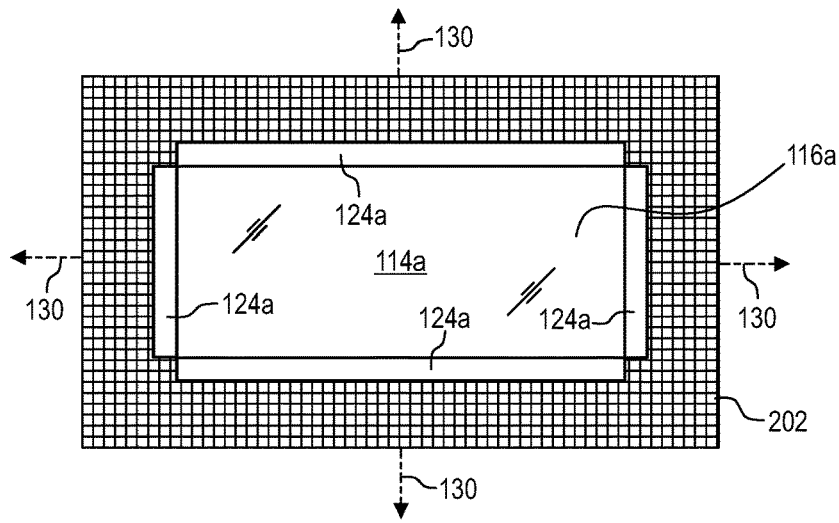
FIG. 30 is a diagrammatic top view corresponding to the configuration shown in FIG. 4.
Figure 31:
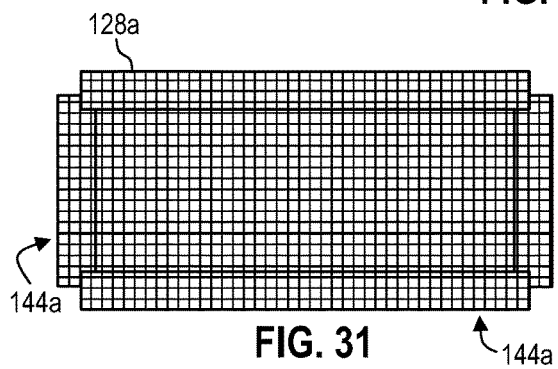
FIG. 31 is a diagrammatic top view corresponding to the configuration shown in FIG. 6.
Figure 32:
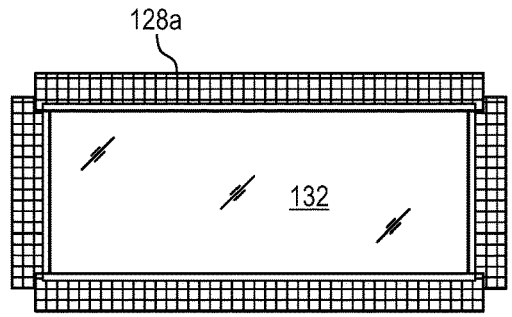
FIG. 32 is a diagrammatic top view corresponding to the configuration shown in FIG. 8.
Figure 65:
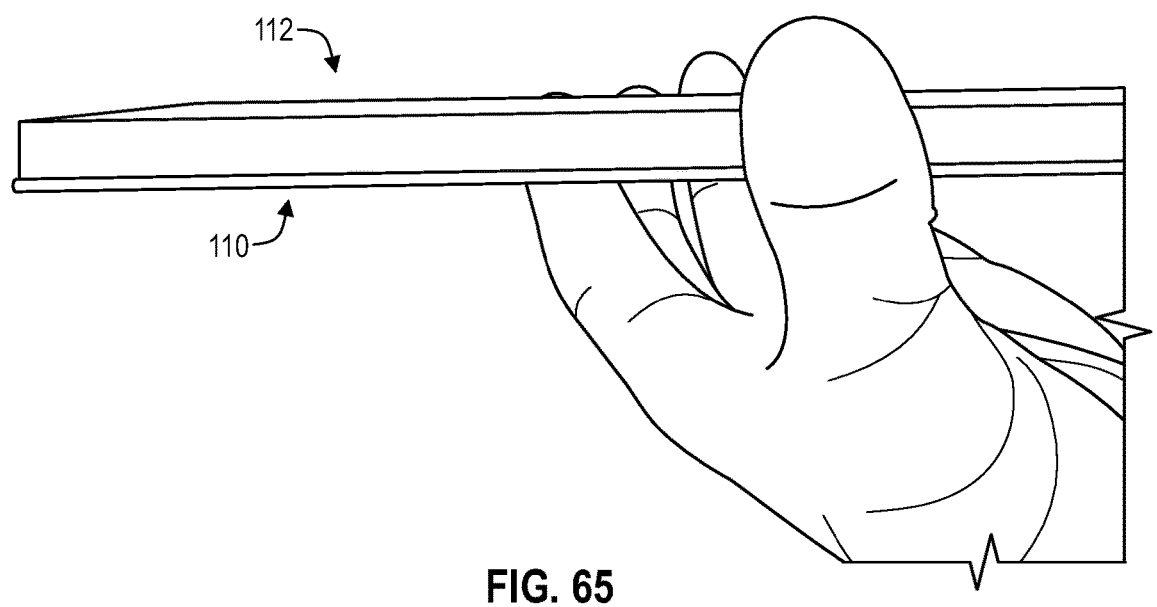
Figure 66:
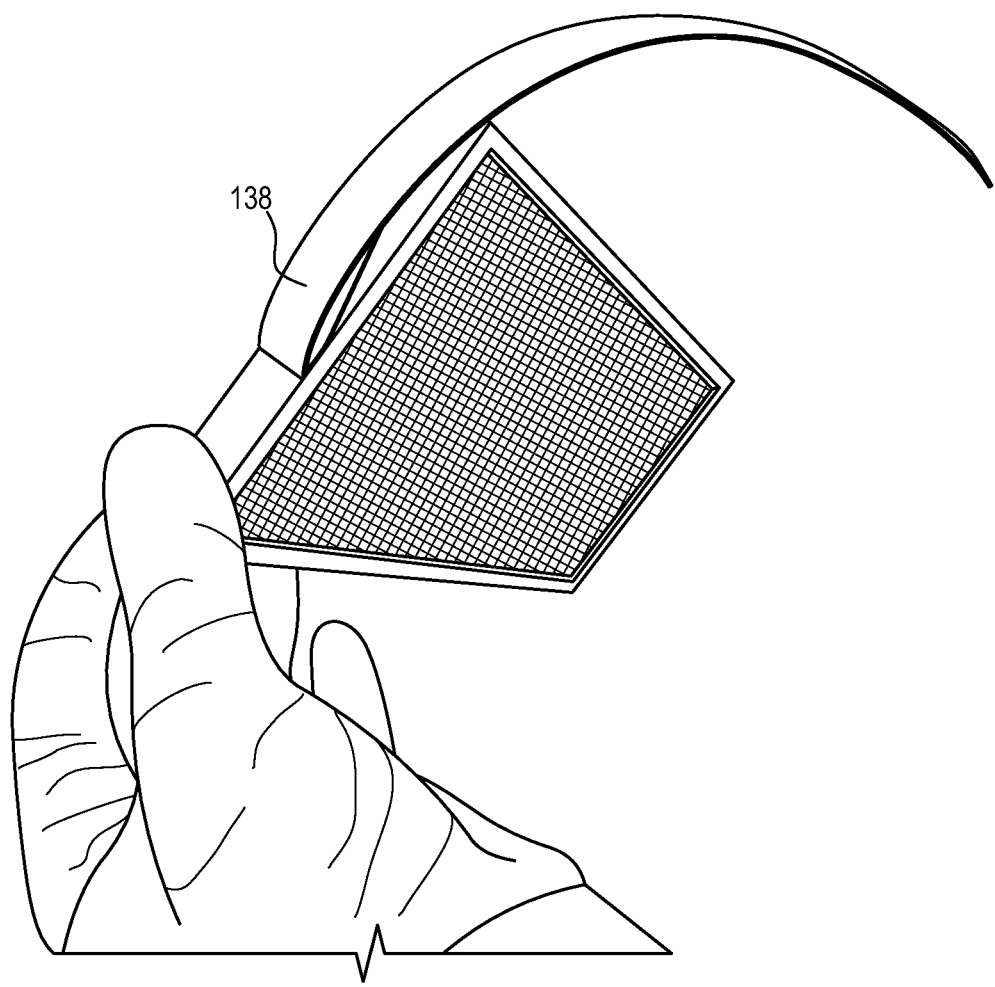
Figure 67:
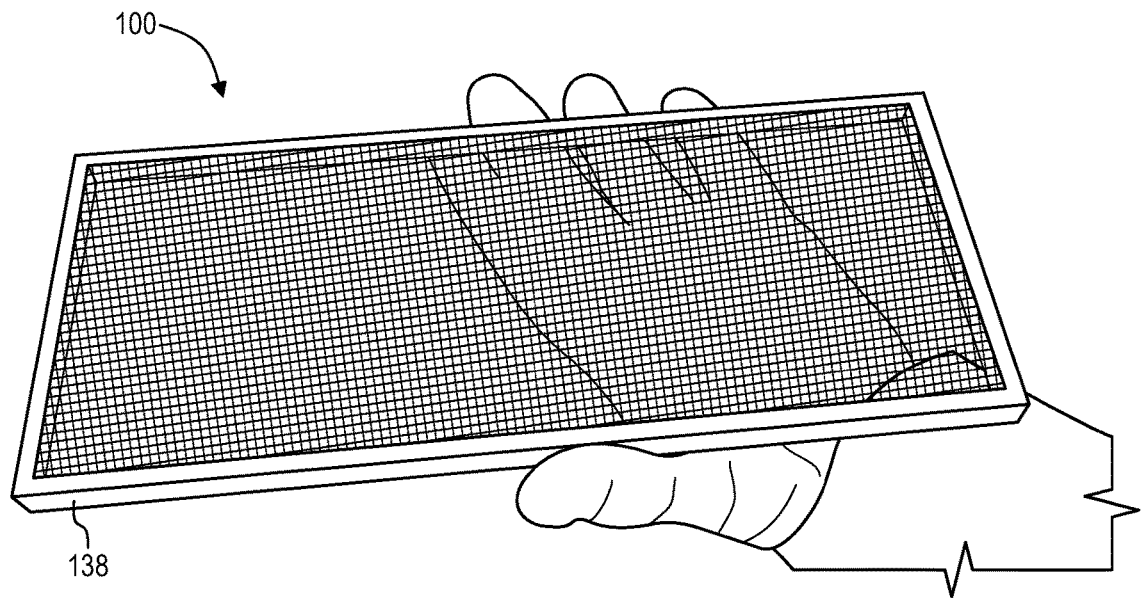
Figure 68:
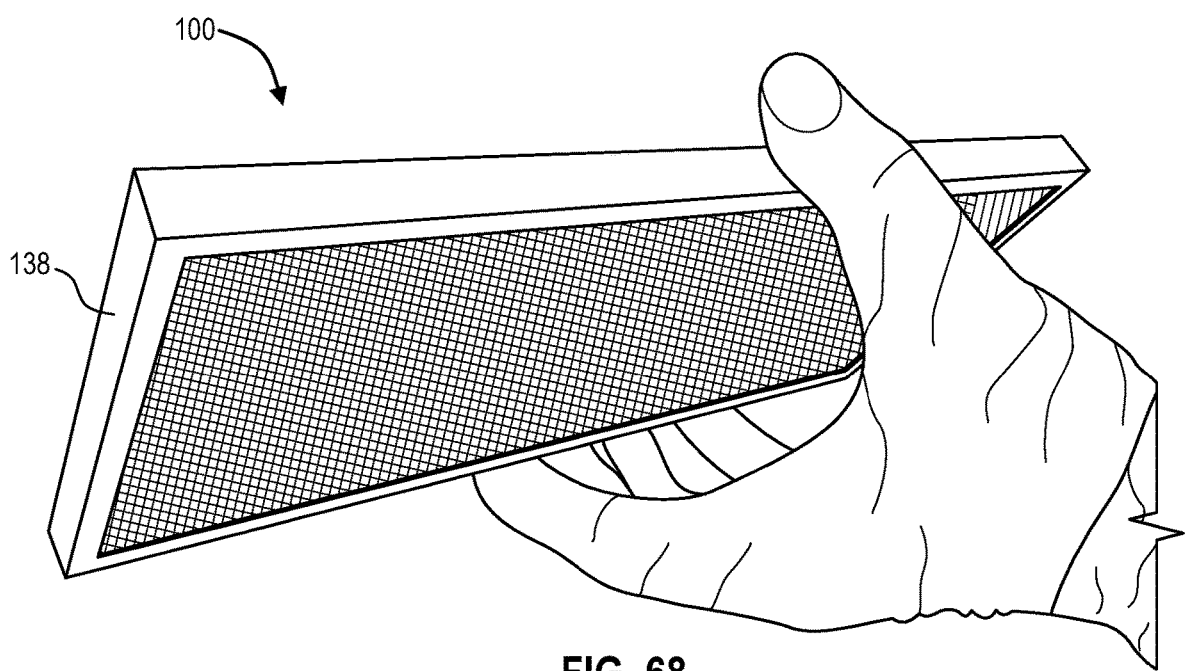

Referring to FIGS. 25, 26 and 68, an RF-shielded window apparatus 100 may comprise a primary panel element 110. Referring to FIGS. 12, 13 and 65, the primary panel element 110 may include a primary backing substrate 114a, a primary shielding adhesion strip 124a, a protective layer 132, a primary RF shield layer 128a, and a protective adhesion strip 136. Referring to FIG. 1, the primary backing substrate 114a may have a primary peripheral edge 120a defined thereabout, a primary inboard face 116a and a primary outboard face 118a. Referring to FIG. 13, the primary shielding adhesion strip 124a may extend along the primary peripheral edge 120a, and may be in adhesive communication with the primary inboard face 116a and primary outboard face 118a. Referring to FIG. 29, the primary shielding adhesion strip 124a may be comprised of multiple individual strip segments. Referring to FIG. 7, the protective layer 132 may have a protective inboard face 152 and a protective outboard face 154. Referring to FIGS. 6 and 13, the primary RF shield layer 128a may have a primary shield periphery 144a and may be disposed between the primary backing substrate 114a and the protective layer 132. The protective adhesion strip 136 may extend along the primary peripheral edge 120a and may be in adhesive communication with the protective outboard face 154 and the primary shield periphery 144a.

Figure 14:
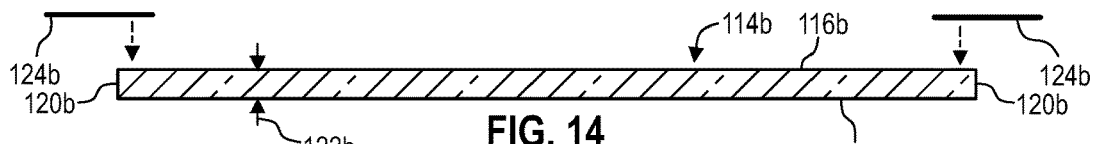
FIGS. 14-22 are cross-sectional views diagrammatically illustrating an example sequence of steps for manufacturing a secondary panel element for use in constructing an RF-shielded window apparatus.
Figure 15:
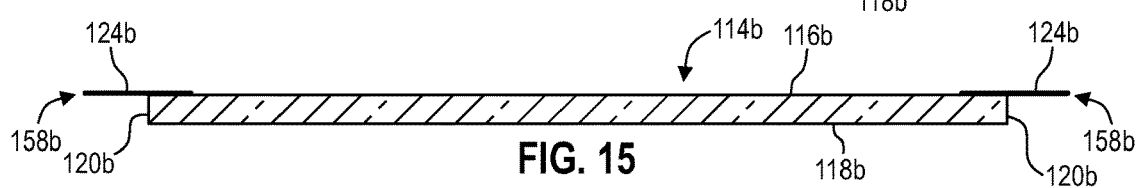
Figure 20:
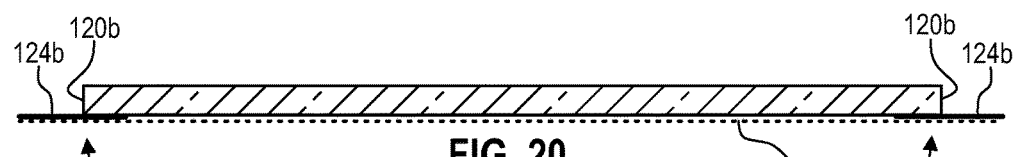
Figure 21:
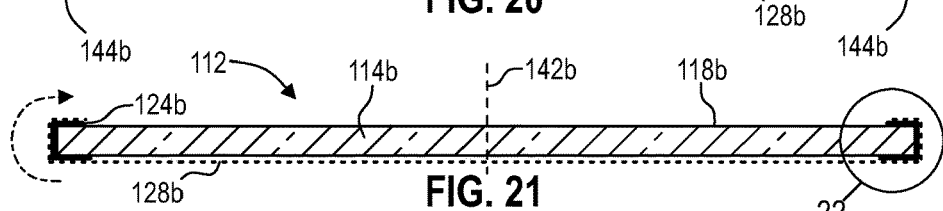
Figure 22:
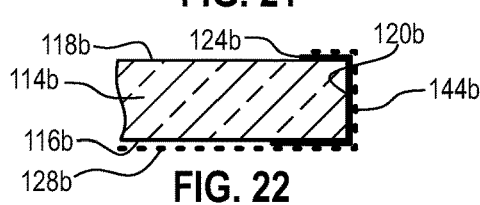
Figure 23:
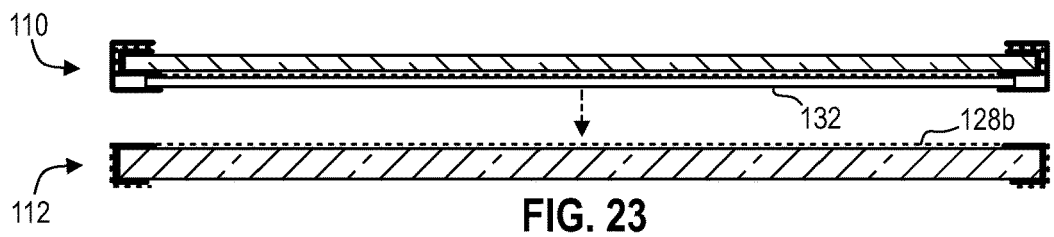
FIGS. 23-26 are cross-sectional views diagrammatically illustrating an example sequence of steps for final manufacturing of an RF-shielded window apparatus comprising a primary panel element and a secondary panel element.
Figure 24:
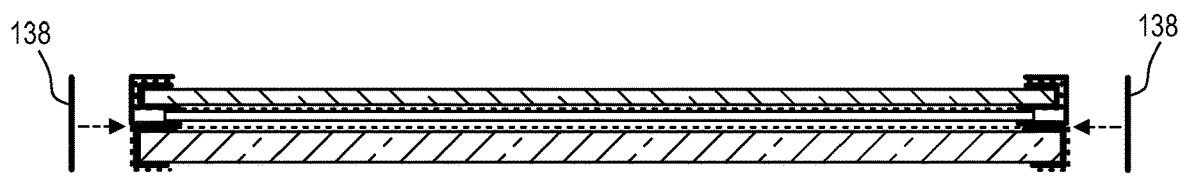
Figure 44:
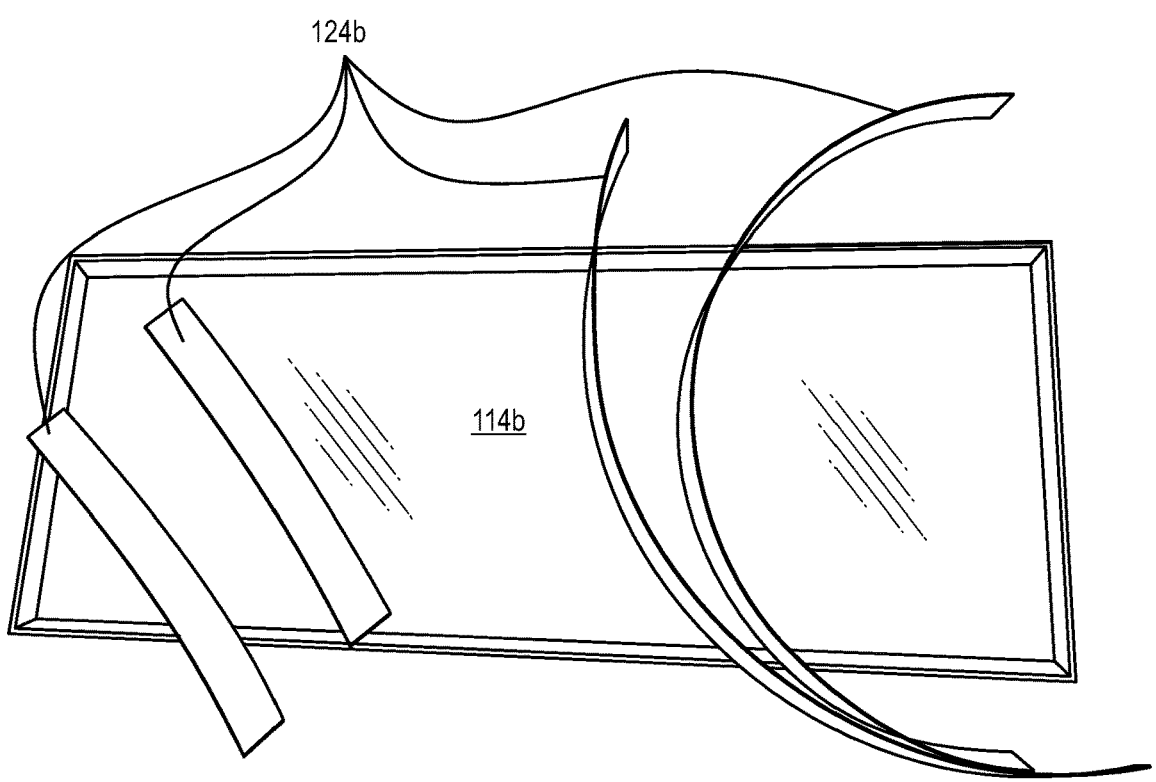
Figure 45:
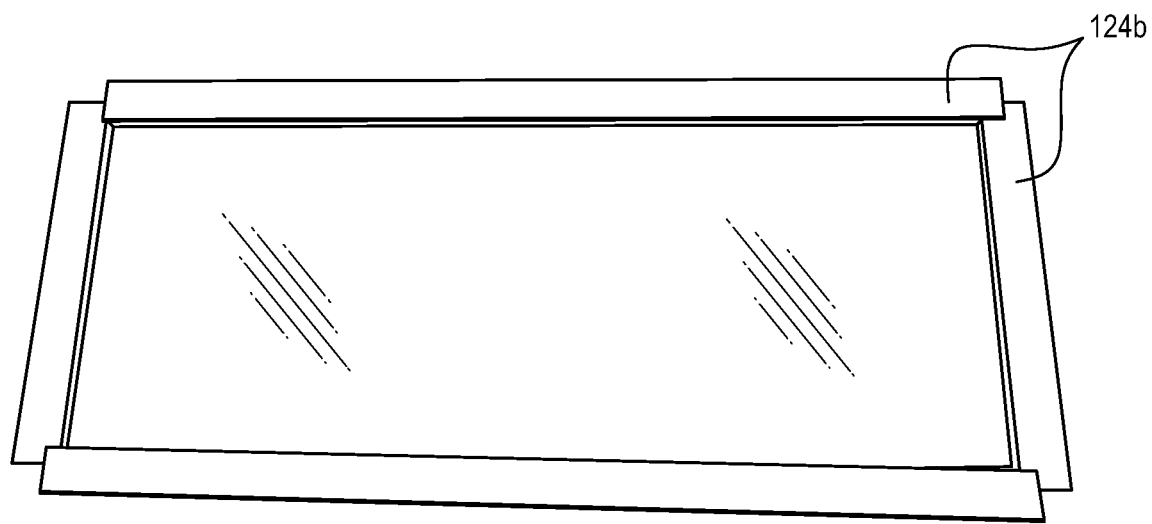

Referring to FIGS. 25, 26 and 68, particular implementations of an RF-shielded window apparatus 100 may further comprise a secondary panel element 112. Referring to FIGS. 21 and 22, the secondary panel element 112 may include a secondary backing substrate 114b, a secondary shielding adhesion strip 124b, and optionally a secondary RF shield layer 128b. Referring to FIGS. 14 and 36, the secondary backing substrate 114b may have a secondary peripheral edge 120b defined thereabout, a secondary inboard face 116b and a secondary outboard face 118b. Referring to FIGS. 22, the secondary shielding adhesion strip 124b may extend along the secondary peripheral edge 120b and may be in adhesive communication with the secondary inboard face 116b and secondary outboard face 118b. Referring to FIGS. 36 and 44, the secondary shielding adhesion strip 124b may be comprised of multiple individual strip segments. Referring to FIGS. 20 and 21, the secondary RF shield layer 128b may have a secondary shield periphery 144b and being disposed across the secondary inboard face 116b.

Referring to FIGS. 25, 26 and 65, in certain preferred implementations of the RF-shielded window apparatus 100, the first panel element 110 and the second panel element 112 may be secured to one another such that the primary RF shield layer 128a, the secondary RF shield layer 128b and the protective layer 132 are collectively disposed between the primary backing substrate 114a and the secondary backing substrate 114b. In particular such implementations, the primary RF shield layer 128a and the secondary RF shield layer 128b may be in electrically-conductive communication with one another. By way of example, the electrically-conductive communication may be by way of, for example, the protective adhesion strip 136. Referring to FIGS. 24-26 and 68, the RF-shielded window apparatus 100 may further comprise a panel joining strip 138 facilitating the securement of the first panel element 110 to the second panel element 112. In such case, the electrically-conductive communication between the primary RF shield layer 128a and the secondary RF shield layer 128b may preferably be at least in part by way of the panel joining strip 138.

Figure 33:
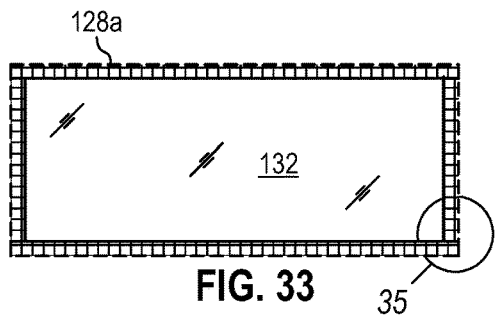
FIG. 33 is a diagrammatic top view corresponding to the configuration shown in FIG. 12.
Figure 34:
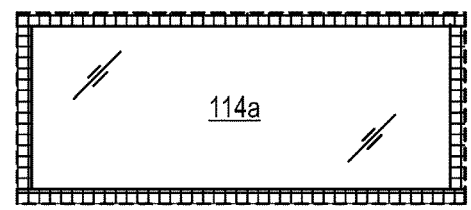
FIG. 34 is a diagrammatic bottom view corresponding to the configuration shown in FIG. 12.
Figure 35:
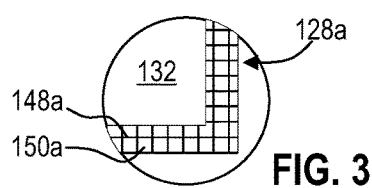
FIG. 35 is a magnified view of detail 35 in FIG. 33.
Figure 42:
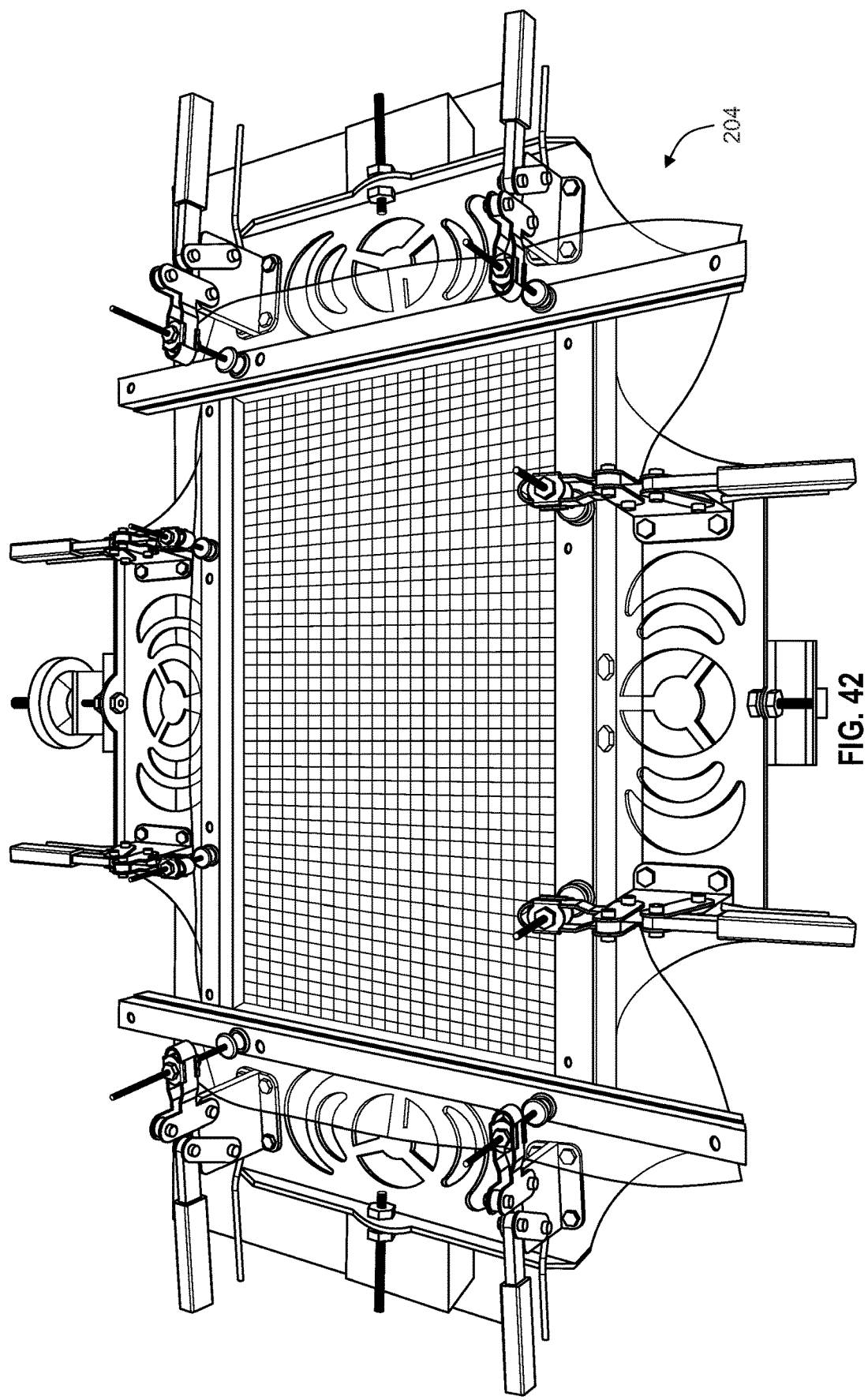
FIG. 42 is diagrammatic perspective view of an example precursor sheet of secondary RF-shielding material being subjected to in-plane tensile loading by a shielding stretching device, such as a conventional silk screen panel stretcher.
Figure 43:
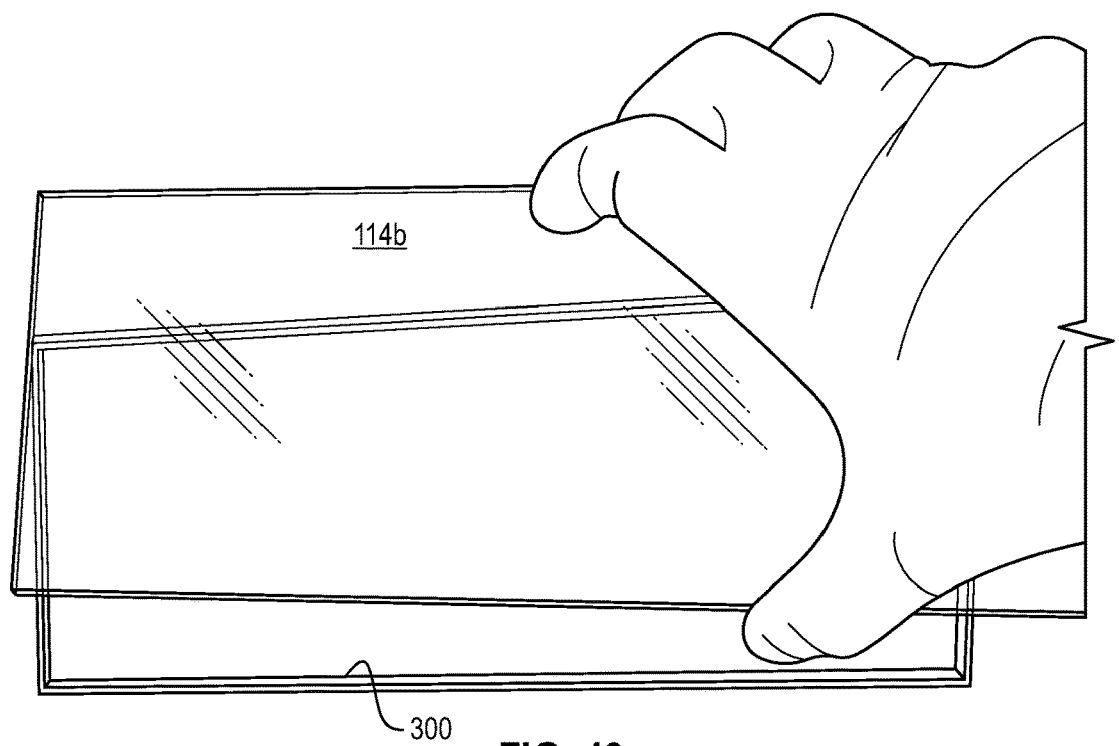
FIGS. 43-50 illustrate an example sequence of steps for manufacturing one non-limiting example of a secondary panel element for use in constructing an RF-shielded window apparatus.

Referring to FIGS. 33 and 35, in particular implementations of the RF-shielded window apparatus 100, the primary RF shield layer 128a may be comprised of a metallic mesh of interconnected primary shield filaments 148a defining primary shield voids 150a therebetween. Similarly, referring to FIGS. 39 and 41, the secondary RF shield layer 128b may be comprised of a metallic mesh of interconnected secondary shield filaments 148b defining secondary shield voids 150b therebetween. In particular such implementations of the RF-shielded window apparatus 100, the primary shield voids 150a are larger than the secondary shield voids 150b. In alternate implementations of the RF-shielded window apparatus 100, the primary shield voids 150a are smaller than the secondary shield voids 150b.

In certain implementations of the RF-shielded window apparatus 100, the primary RF shield layer 128a is comprised of copper, and the secondary RF shield layer 128b is comprised a copper and nickel.

In particular implementations of the RF-shielded window apparatus 100, the primary backing substrate 114a may have a thickness of from $\frac{1}{16}$ to $\frac{1}{8}$ inches, and the secondary backing substrate 114b may have a thickness of from $\frac{1}{4}$ to $\frac{1}{2}$ inches.

Figures 27, 28:
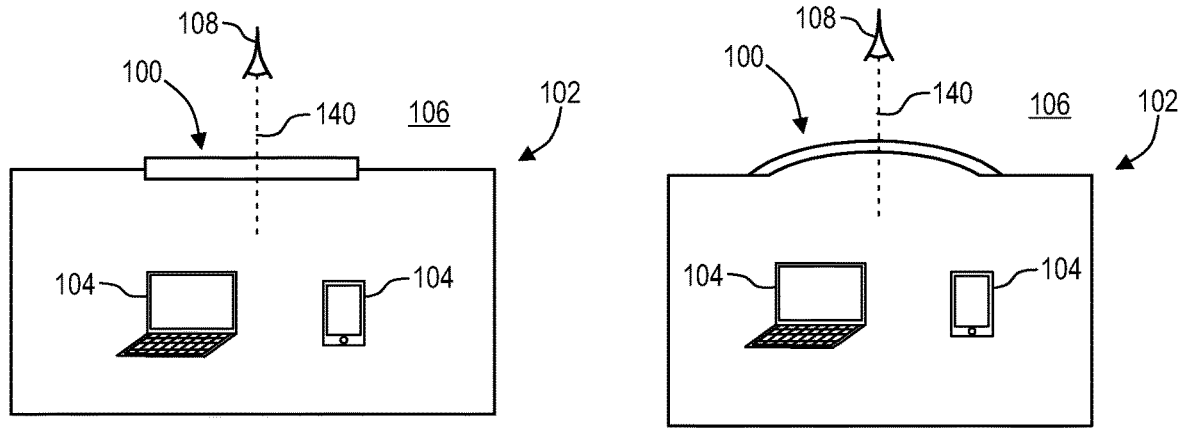
FIG. 27 is a diagrammatic cross-sectional view illustrating an example RF-shielded enclosure incorporating an RF-shielded window apparatus, wherein the electronic devices housed within the enclosure are viewable by a human eye through the window apparatus from a viewpoint outside of the enclosure, and the window apparatus is flat planar.
FIG. 28 is a diagrammatic cross-sectional view illustrating an example RF-shielded enclosure incorporating an RF-shielded window apparatus, wherein the electronic devices housed within the enclosure are viewable by a human eye through the window apparatus from a viewpoint outside of the enclosure, and the window apparatus is curved.

Referring to FIGS. 25, 27 and 28, certain implementations the RF-shielded window apparatus 100 may include a light transmission zone 156 within which visible light can pass through the entire RF-shielded window apparatus 100 along a light transition axis 140. In such implementations, the RF-shielded window apparatus 100 may have a visible transmittance of at least 70% within the light transmission zone 156.

The primary backing substrate 114a may preferably be comprised of polycarbonate or the like, and in certain preferred implementations, may have a thickness 122a of $\frac{1}{16}$ to $\frac{1}{8}$ inches. The secondary backing substrate 114b may preferably be comprised of polycarbonate or the like, and in certain preferred implementations, may have a thickness 122b of $\frac{1}{4}$ to $\frac{1}{2}$ inches. The protective layer 132 may preferably be comprised of polyethylene terephthalate (PET), thermoplastic polyurethane (TPU), or laminated tempered glass. In certain preferred implementations of the apparatus 100, the protective adhesion strip 136, the panel joining strip 138 may comprise one or more segments of electrically-conductive adhesive tape. The shielding adhesion strips may preferably comprise, for example, electrically-conductive two-sided adhesive tape, or the like.

Figure 69:
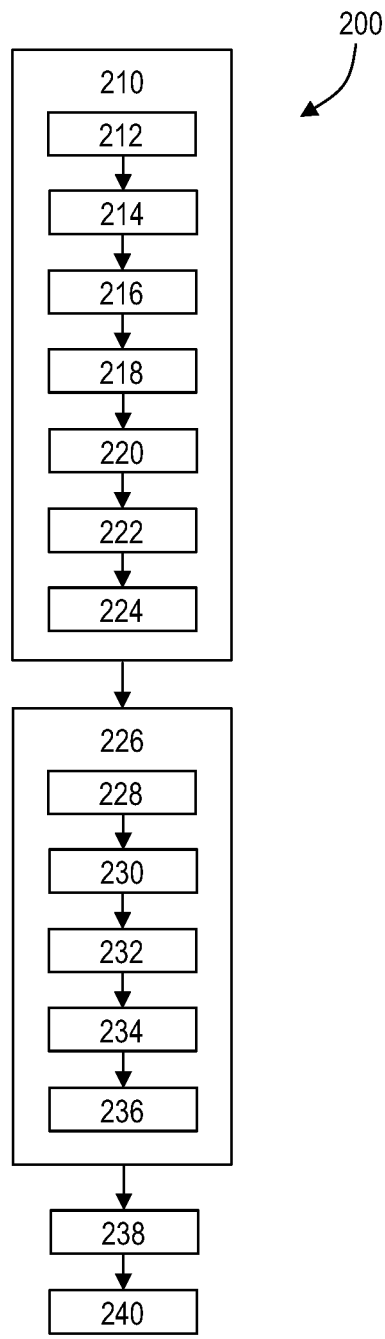
FIG. 69 is a diagrammatic flow chart representing a sequence of steps corresponding to one or more one example methods of manufacturing an RF-shielded window apparatus.

Referring to FIG. 69, a method of manufacturing an RF-shielded window apparatus is shown generally at 200. At block 210, a primary panel element 110 is formed by way of a series of one or more of the steps represented, for example, by blocks 212-224.

At block 212, a primary backing substrate 114a, a primary shielding adhesion strip 124a, a protective layer 132, and a protective adhesion strip 136 are provided. The primary backing substrate 114a may have a primary peripheral edge 120a defined thereabout, a primary inboard face 116a and a primary outboard face 118a. The protective layer 132 may have a protective inboard face 152 and a protective outboard face 154.

Figure 2:
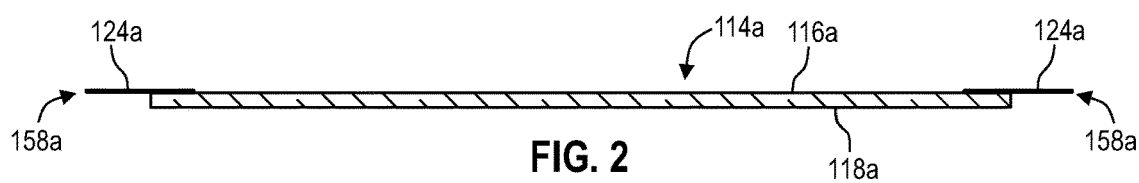
Figure 3:

At block 214, and referring to FIGS. 1, 2 and 29, the primary shielding adhesion strip 124a may be placed in adhesive communication with the primary inboard face 116a and extending partly outward of the primary peripheral edge 120a, thereby defining a primary adhesion edge 158a outward of the primary peripheral edge 120a.

Figure 4:
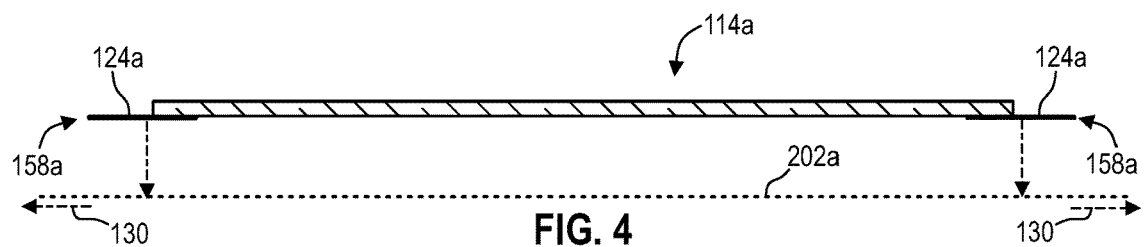
Figure 52:
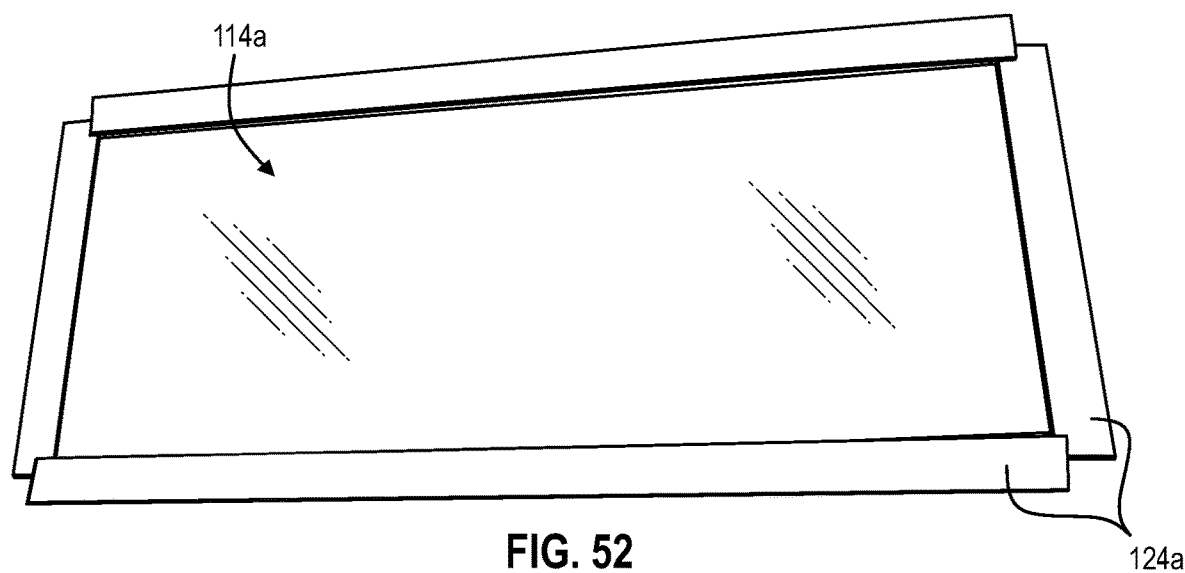
FIGS. 52-63 illustrate an example sequence of steps for manufacturing one non-limiting example of a primary panel element for use in constructing an RF-shielded window apparatus.
Figure 53:
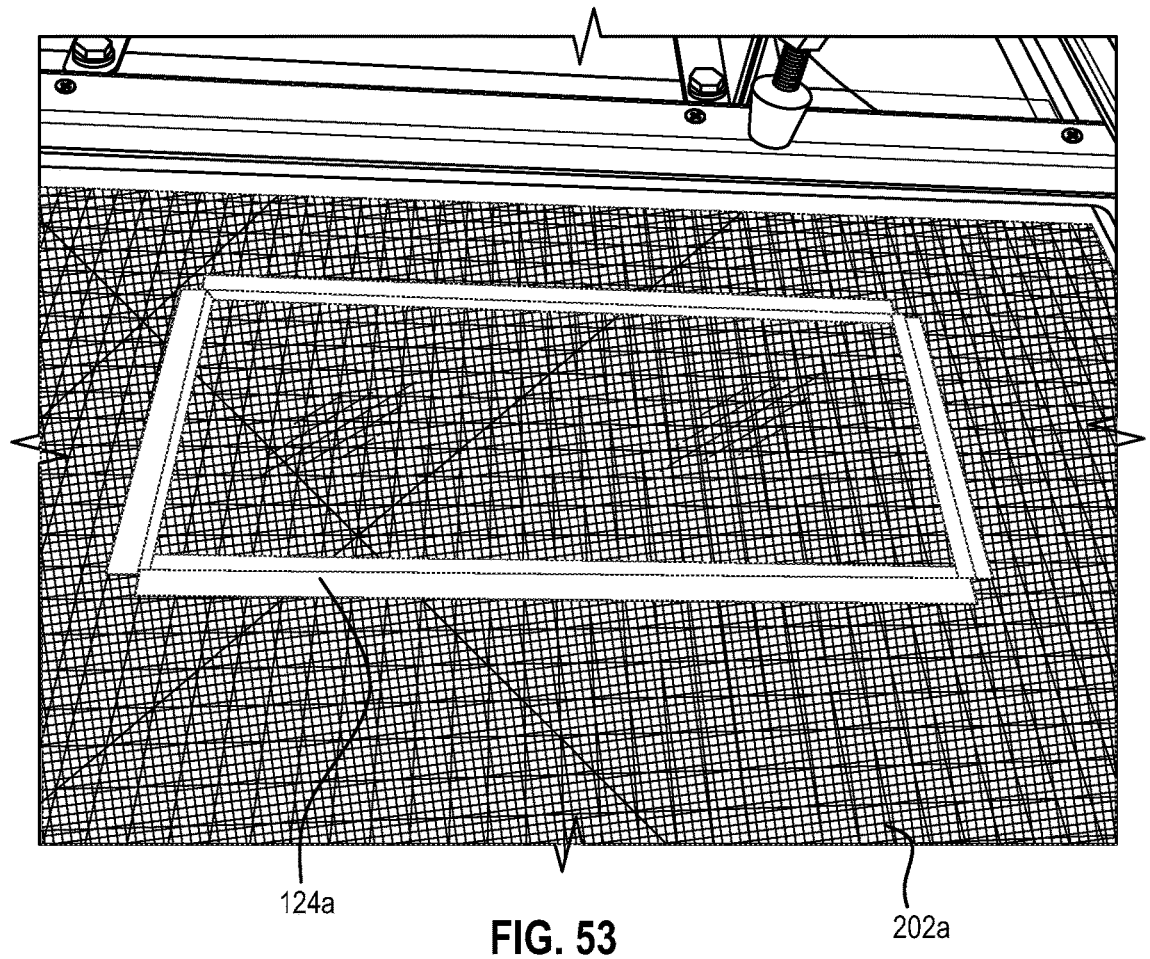
Figure 54:
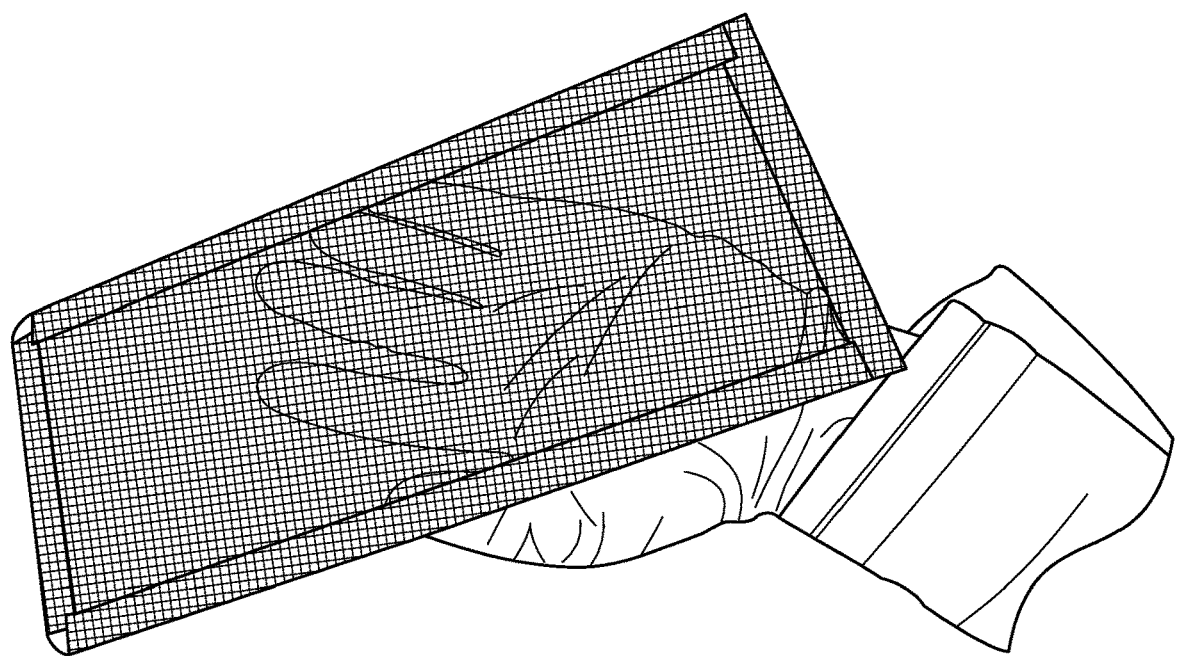

At block 216, and referring to FIGS. 4, 52 and 53, the primary shielding adhesion strip 124a may be positioned in adhesive communication with a precursor sheet of primary RF shielding material 202a while the precursor sheet of primary RF shielding 202a is subject to an in-plane tensile loading 130.

Figure 5:
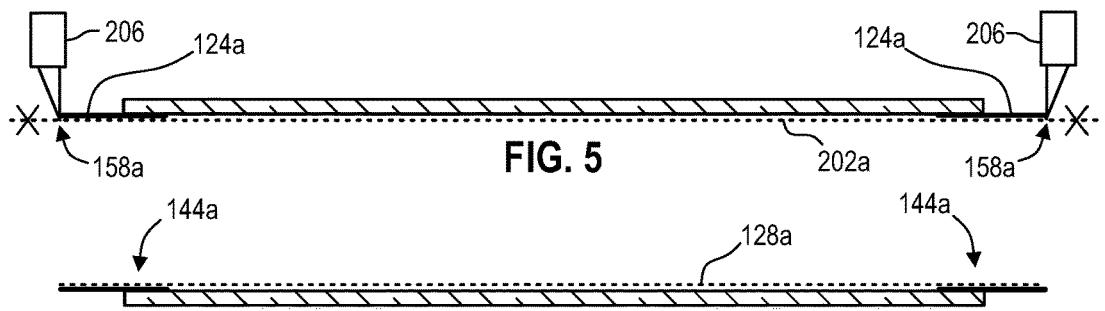
Figure 8:
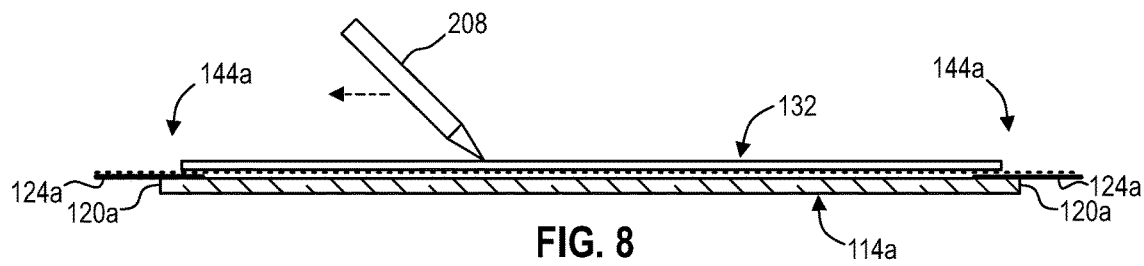
Figure 55:
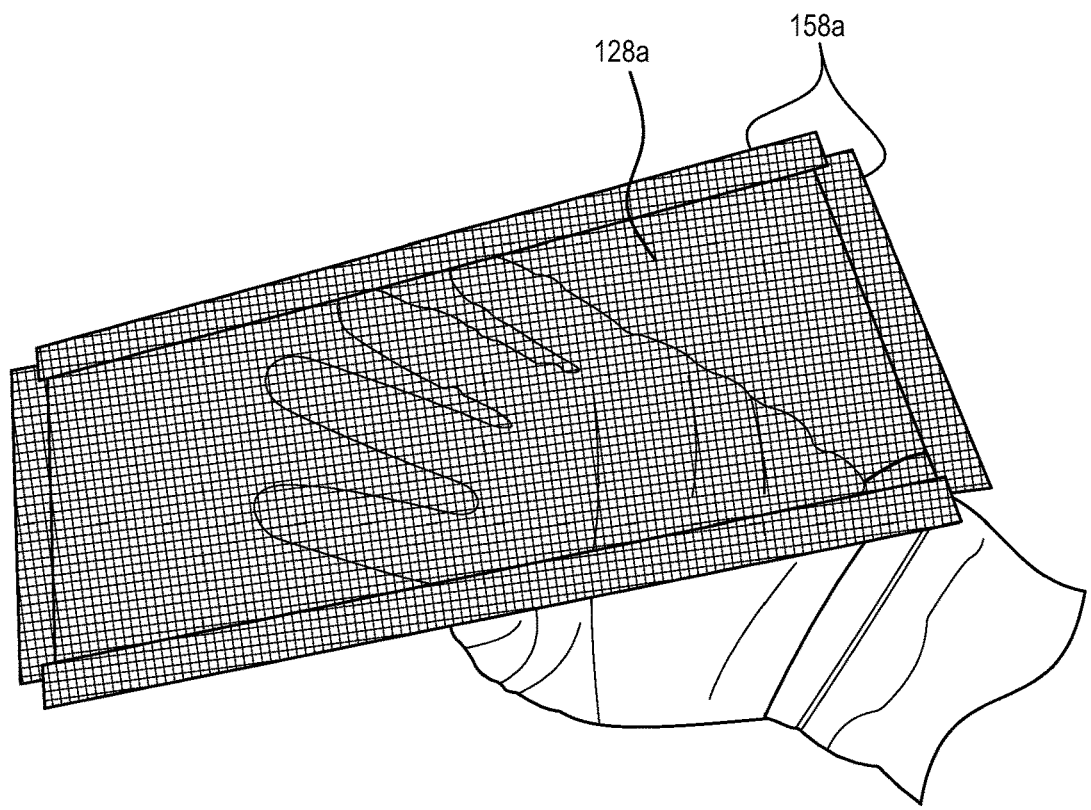
Figure 56:
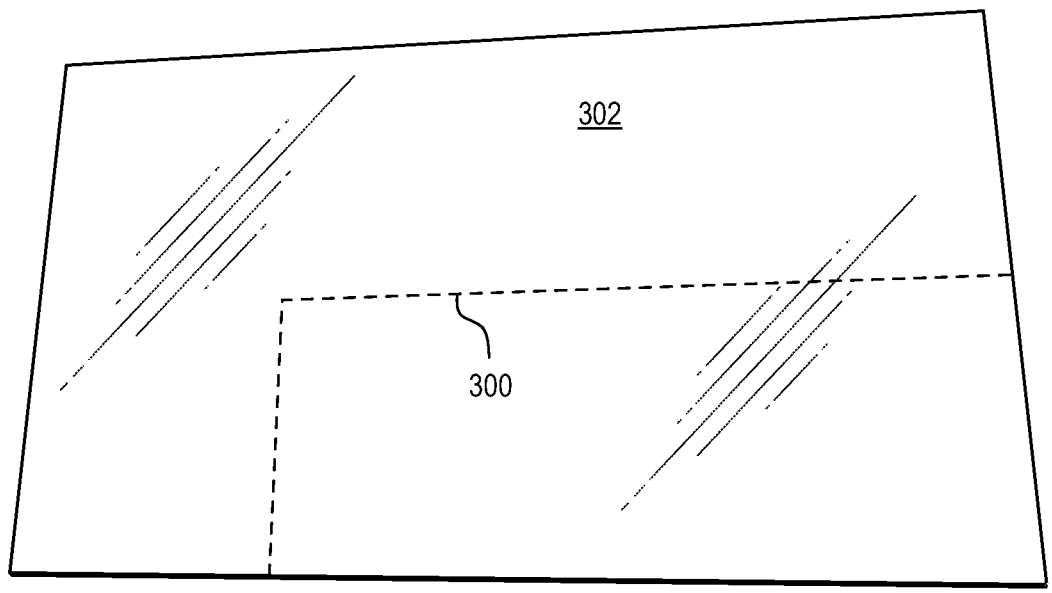
Figure 57:
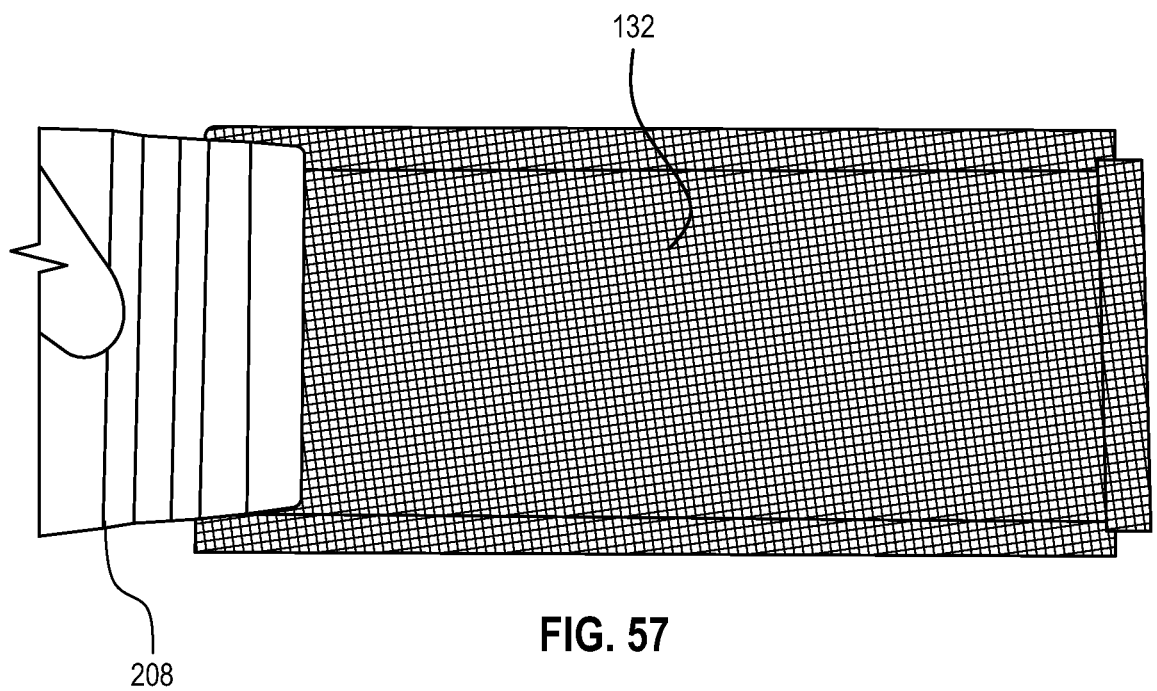
Figure 58:
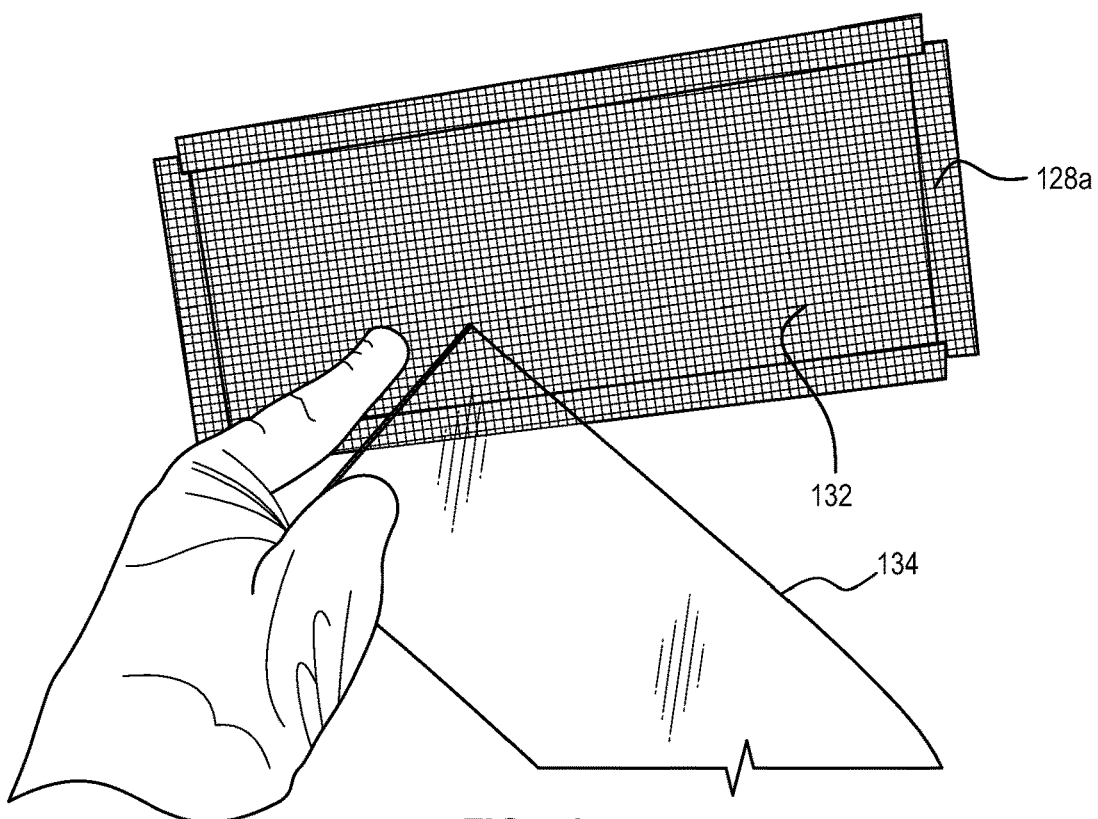

At block 218, and referring to FIGS. 5, 6 and 55, the precursor sheet of primary RF shielding 202a may be trimmed to terminate at the primary adhesion edge 158a, thereby defining a primary RF shield layer 128a adhered to the primary inboard face 116a by way of the primary shielding adhesion strip 124a. Referring to FIG. 8, the primary RF shield layer 128a may have a primary shield periphery 144a.

Figure 9:
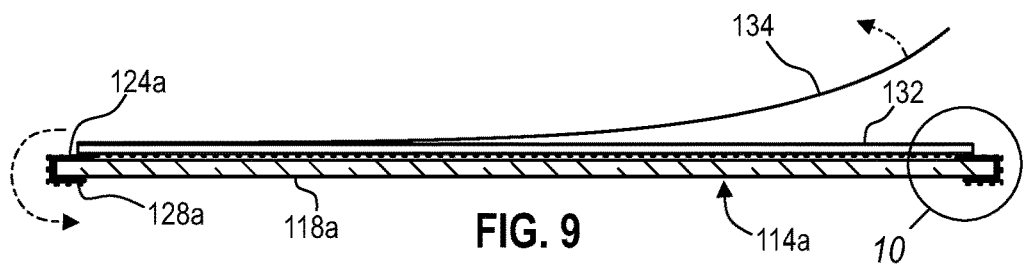
Figure 60:
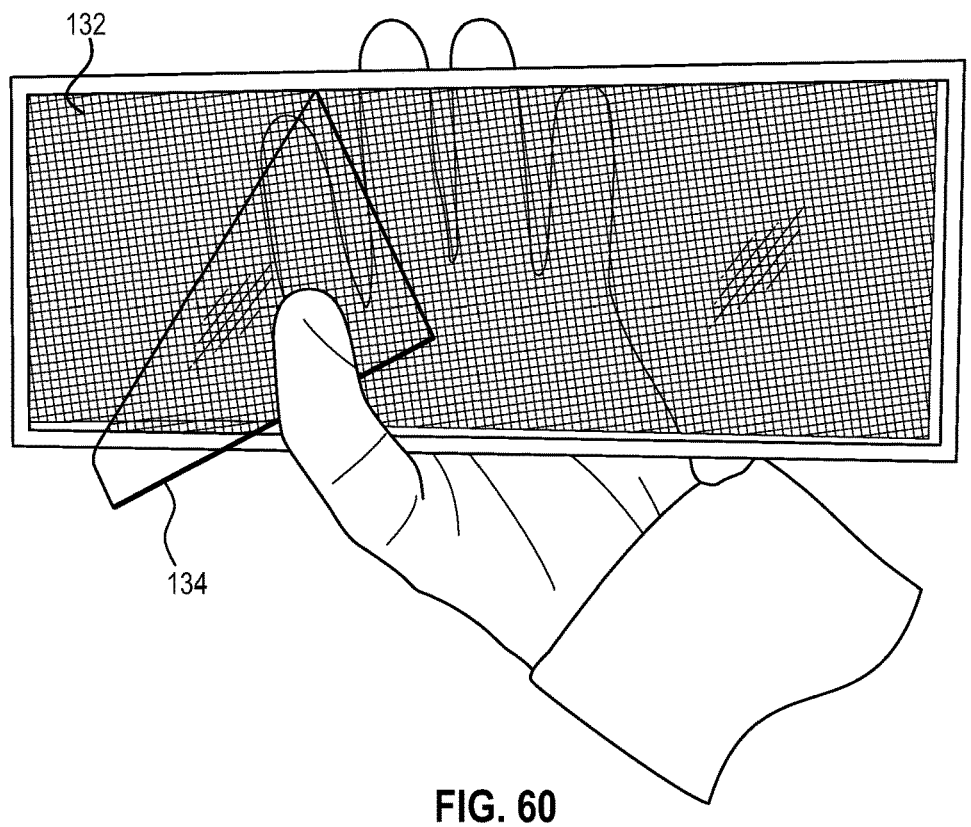
Figure 61:
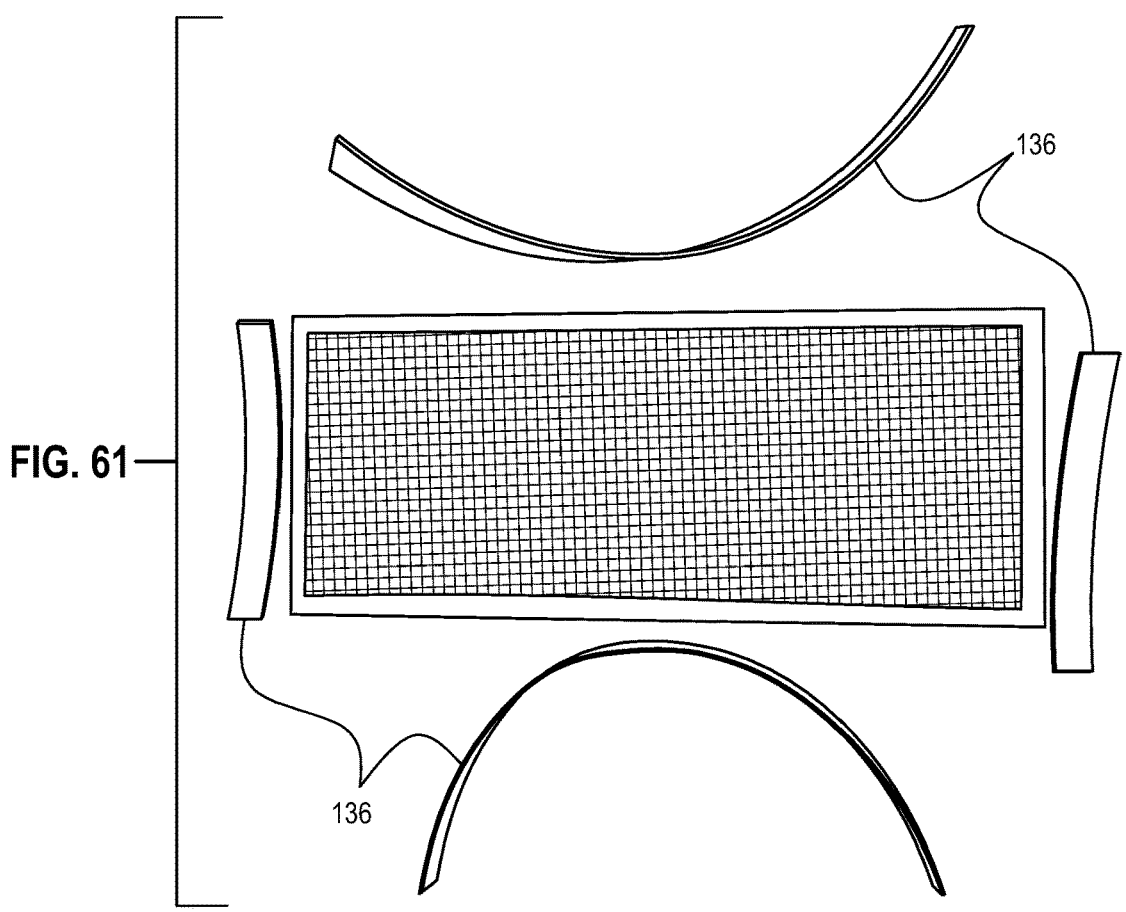
Figure 62:
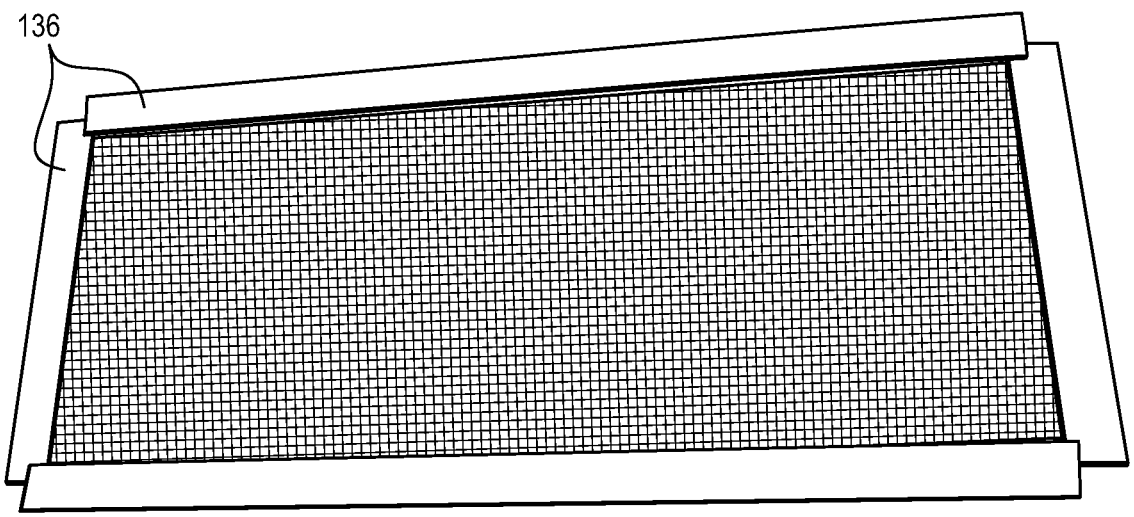
Figure 63:
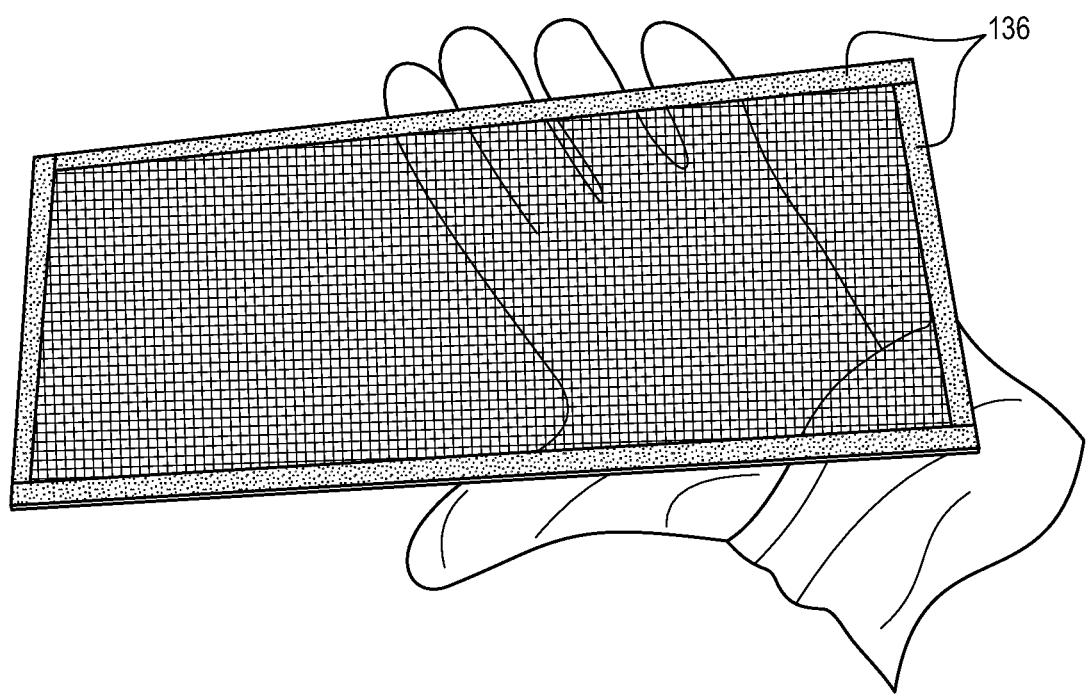
Figure 64:
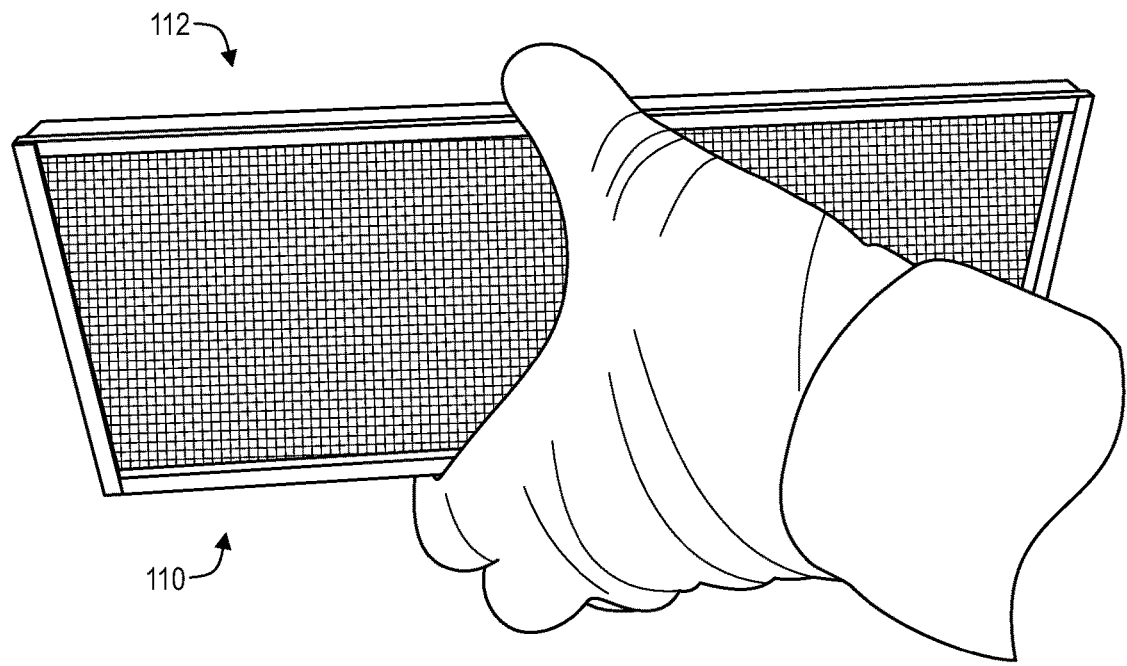
FIGS. 64-68 illustrate an example sequence of steps for final manufacturing of one non-limiting example RF-shielded window apparatus comprising a primary panel element and a secondary panel element secured to one another.

At block 220, and referring to FIGS. 7 and 8, the protective layer 132 may be applied onto the primary RF shield layer 128a. A squeegee 208 or the like may be used to apply the protective layer 132. Referring to FIGS. 9 and 60, a protective outer peel layer (e.g., film) 134 may be peeled off of the protective layer 132.

Figure 10:
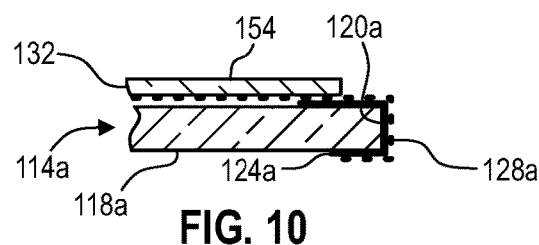
Figure 11:
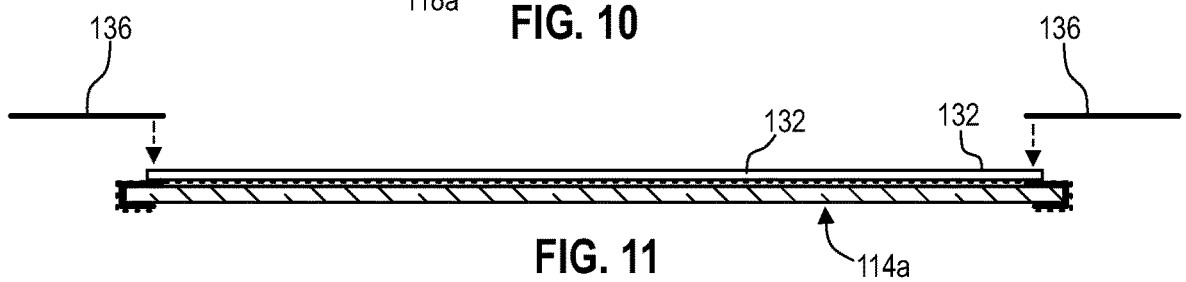
Figure 59:
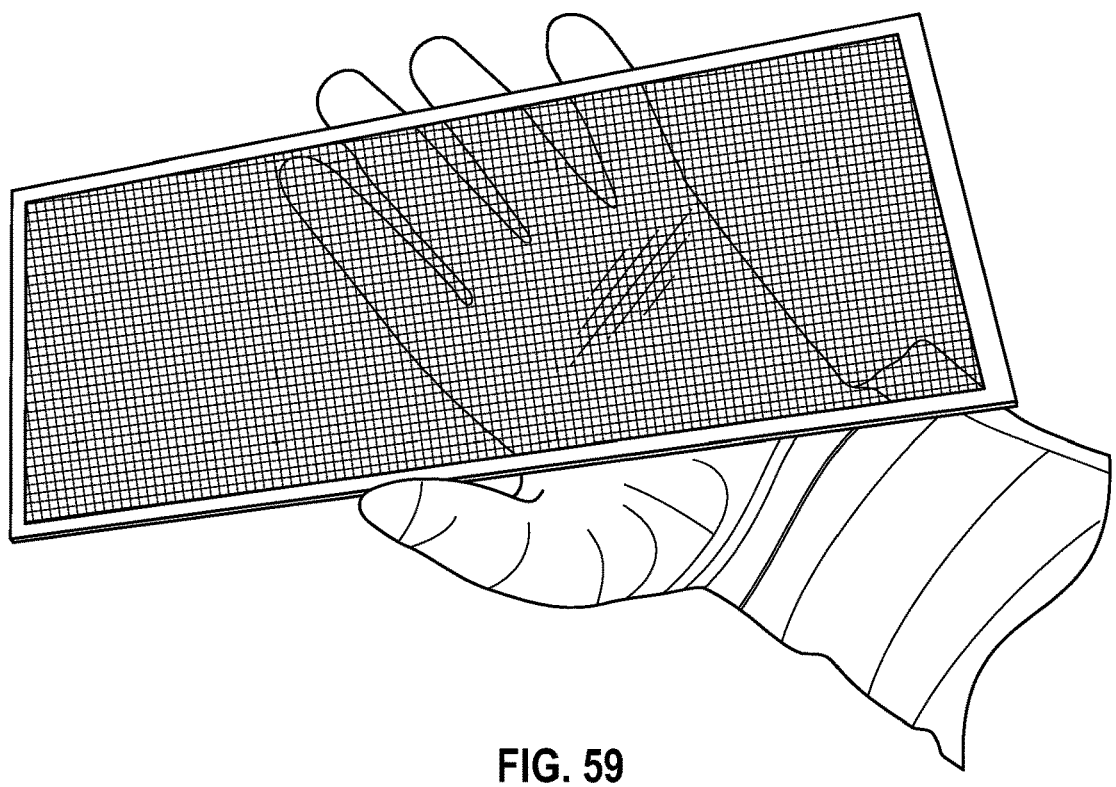

At block 222, and referring to FIGS. 9, 10 and 59, the primary shielding adhesion strip 124a may be wrapped around the primary peripheral edge 120a and onto the primary outboard face 118a.

At block 224, and referring to FIGS. 11-13 and 61-63, the protective adhesion strip 136 may be affixed to the protective outboard face 154 and the protective adhesion strip 136 may be wrapped around the primary peripheral edge 120a, whereby the protective adhesion strip 136 may preferably be retained in electrically-conductive communication with the primary RF shield layer 128a.

The method 200 may further one or more steps shown at block 226, wherein a secondary panel element 112 is formed by way of a series of one or more of the steps represented, for example, by blocks 228-236.

At block 228, and referring to FIGS. 14 and 44, a secondary backing substrate 114b and a secondary shielding adhesion strip 124b may be provided, wherein the secondary backing substrate 114b may have a secondary peripheral edge 120b defined thereabout, a secondary inboard face 116b and a secondary outboard face 118b.

Figure 16:
Figure 46:
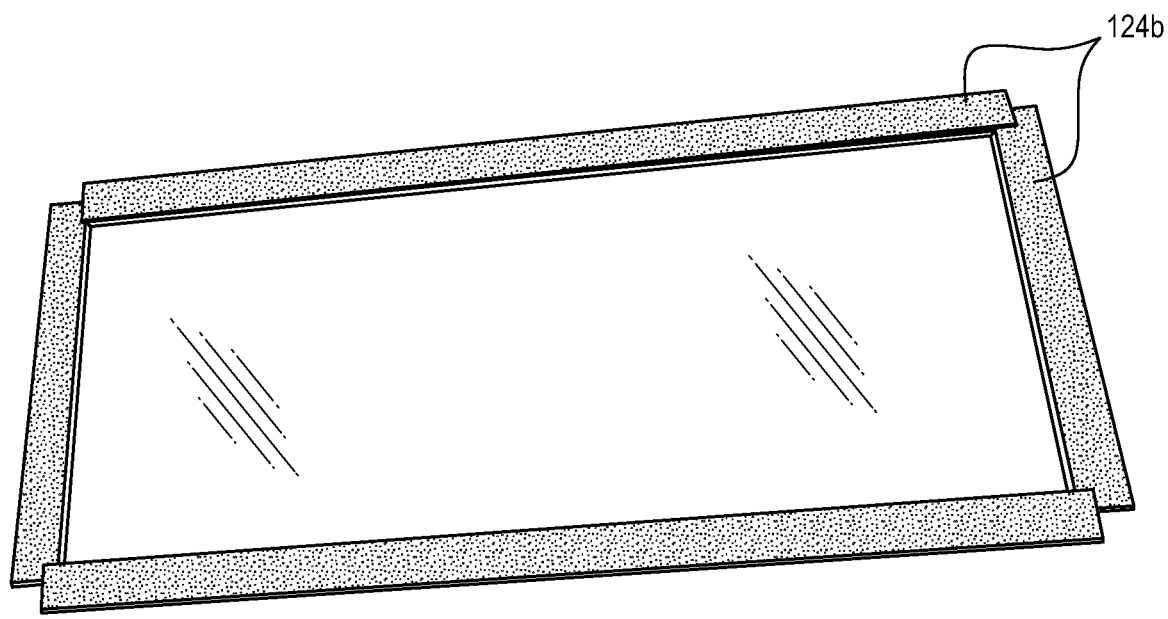

At block 230, and referring to FIGS. 14-17, 36 and 45, the secondary shielding adhesion strip 124b may be placed in adhesive communication with the secondary inboard face 116b and extending partly outward of the secondary peripheral edge 120b, thereby defining a secondary adhesion edge outward of the secondary peripheral edge 158b. As shown in FIGS. 16 and 46, adhesive backing may be peeled from the adhesions strip 124b to expose the underlying adhesive.

Figure 17:
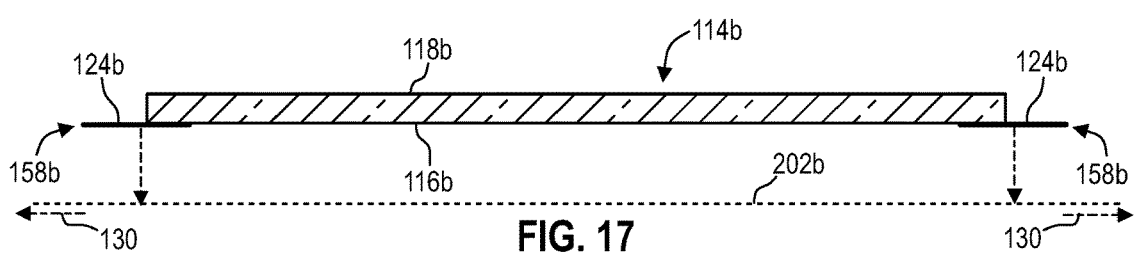
Figure 18:
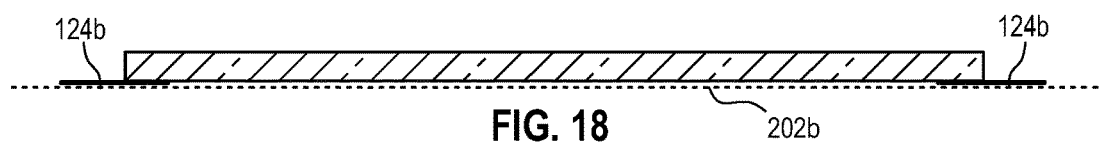
Figure 19:
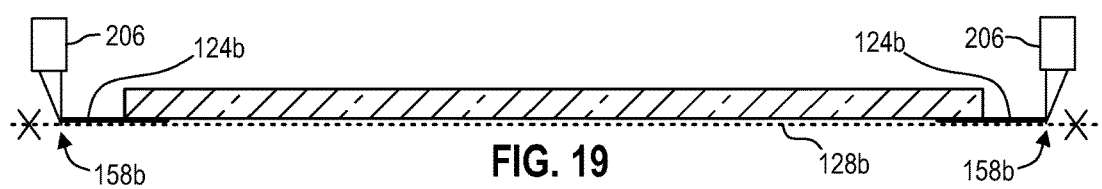
Figure 47:
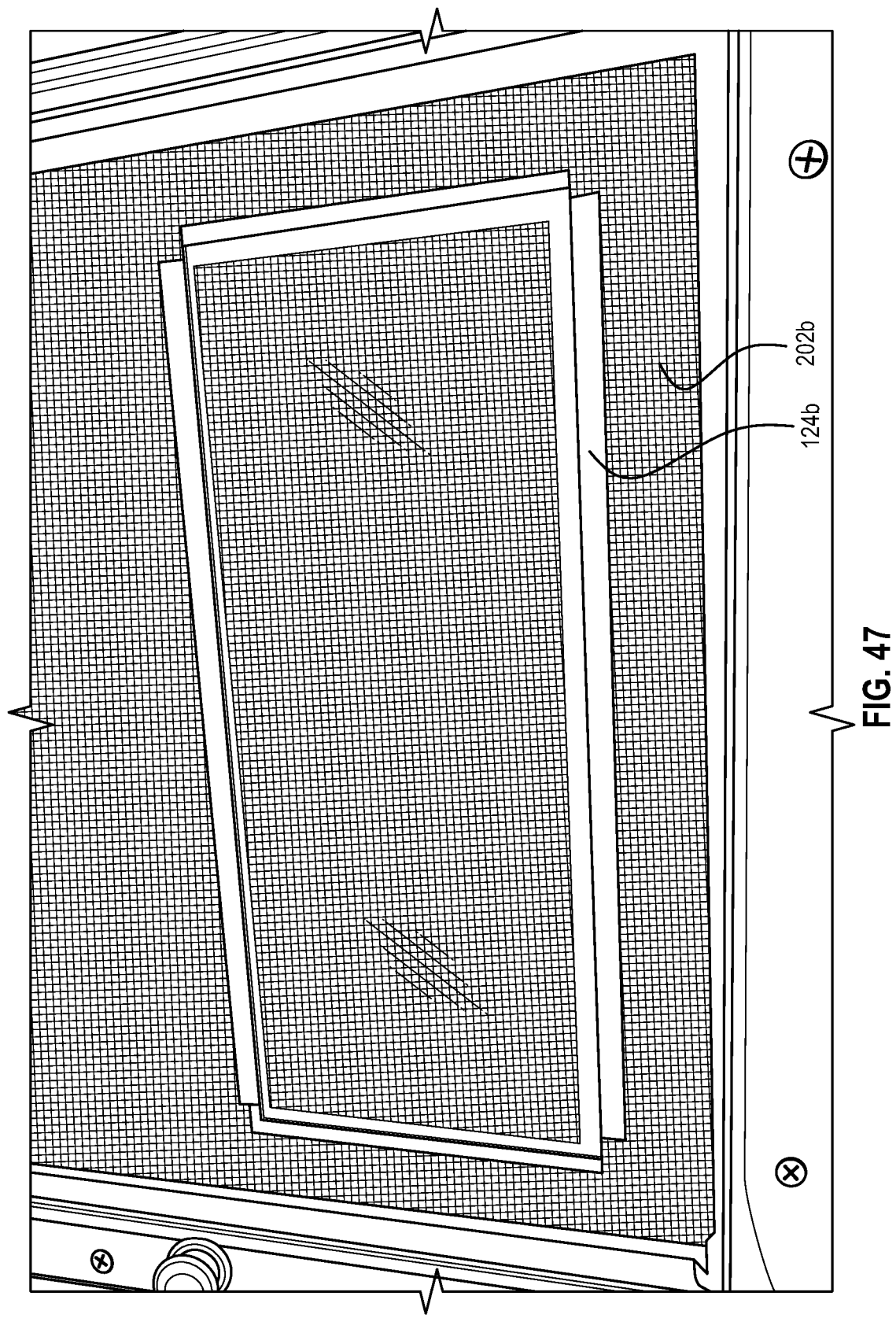
Figure 48:
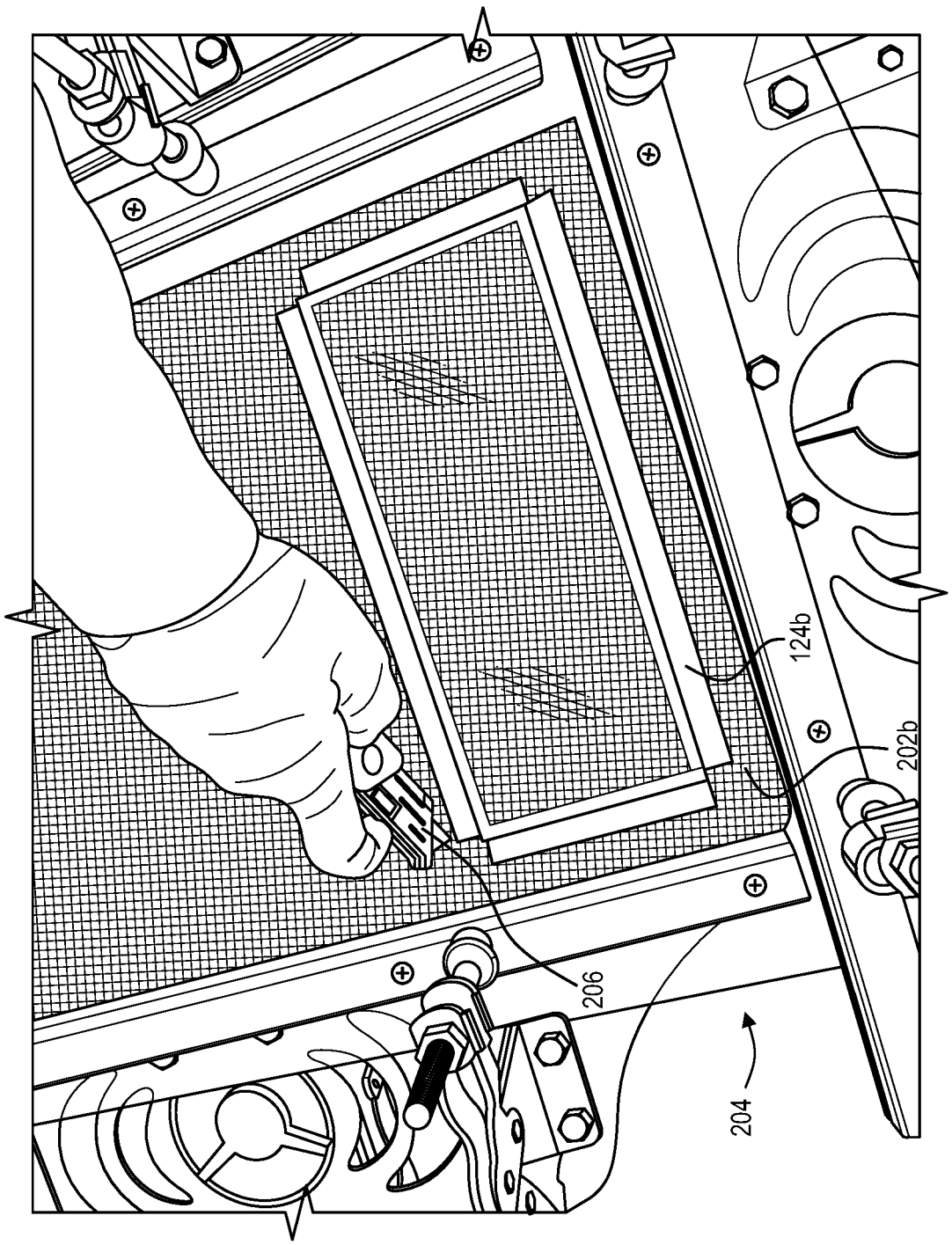
Figure 49:
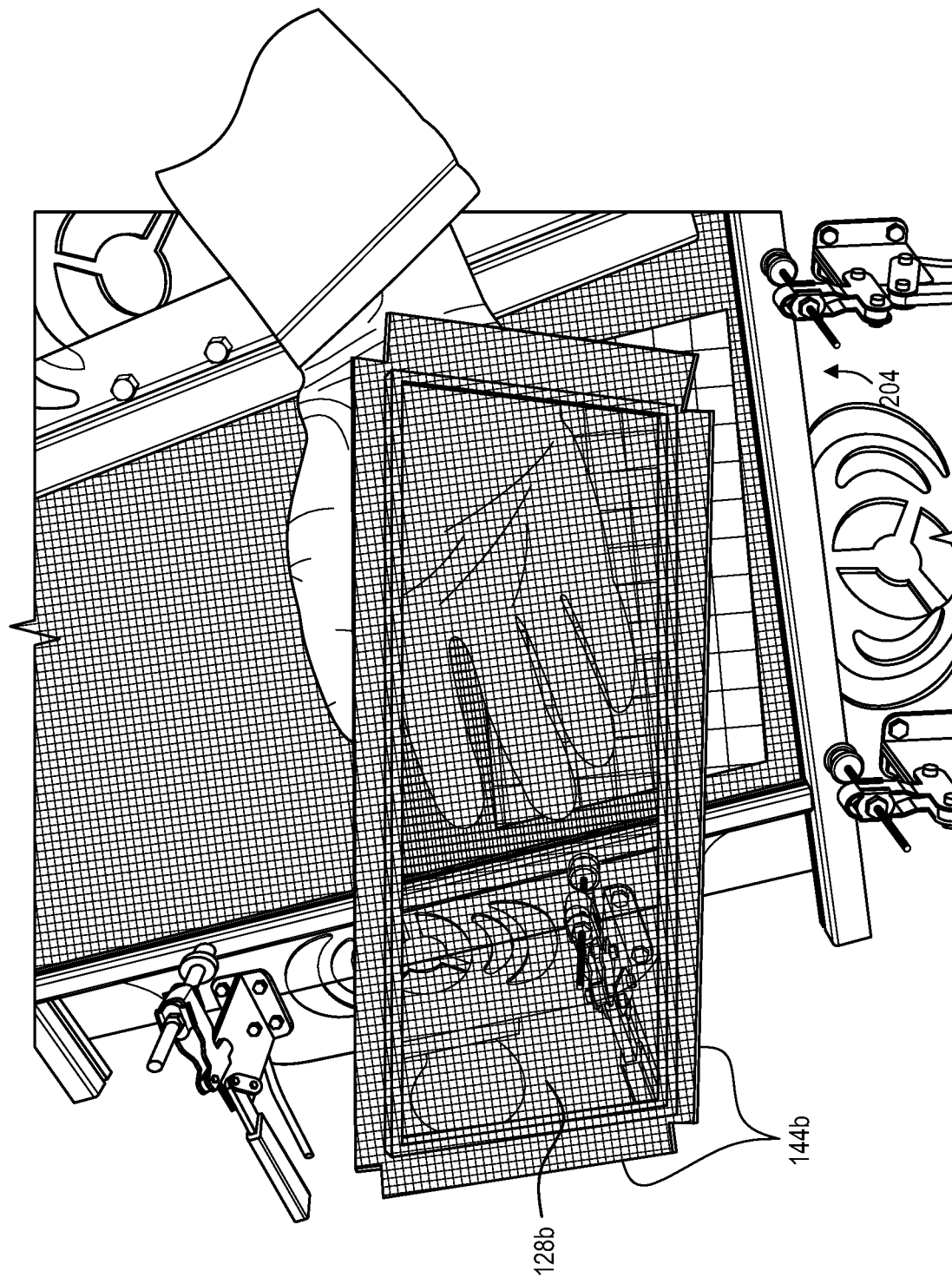

At block 232, and referring to FIGS. 17 and 47, the secondary shielding adhesion strip 124b may be positioned in adhesive communication with a precursor sheet of secondary RF shielding material 202b while the precursor sheet of secondary RF shielding is subject to an in-plane tensile loading 130.

At block 234, and referring to FIGS. 19, 20, 48 and 49, the precursor sheet of secondary RF shielding 202b may be trimmed to terminate at the secondary adhesion edge 158b, thereby defining a secondary RF shield layer 128b adhered to the secondary inboard face 116b by way of the secondary shielding adhesion strip 124b. The secondary RF shield layer 128b may have a secondary shield periphery 144b.

Figure 50:
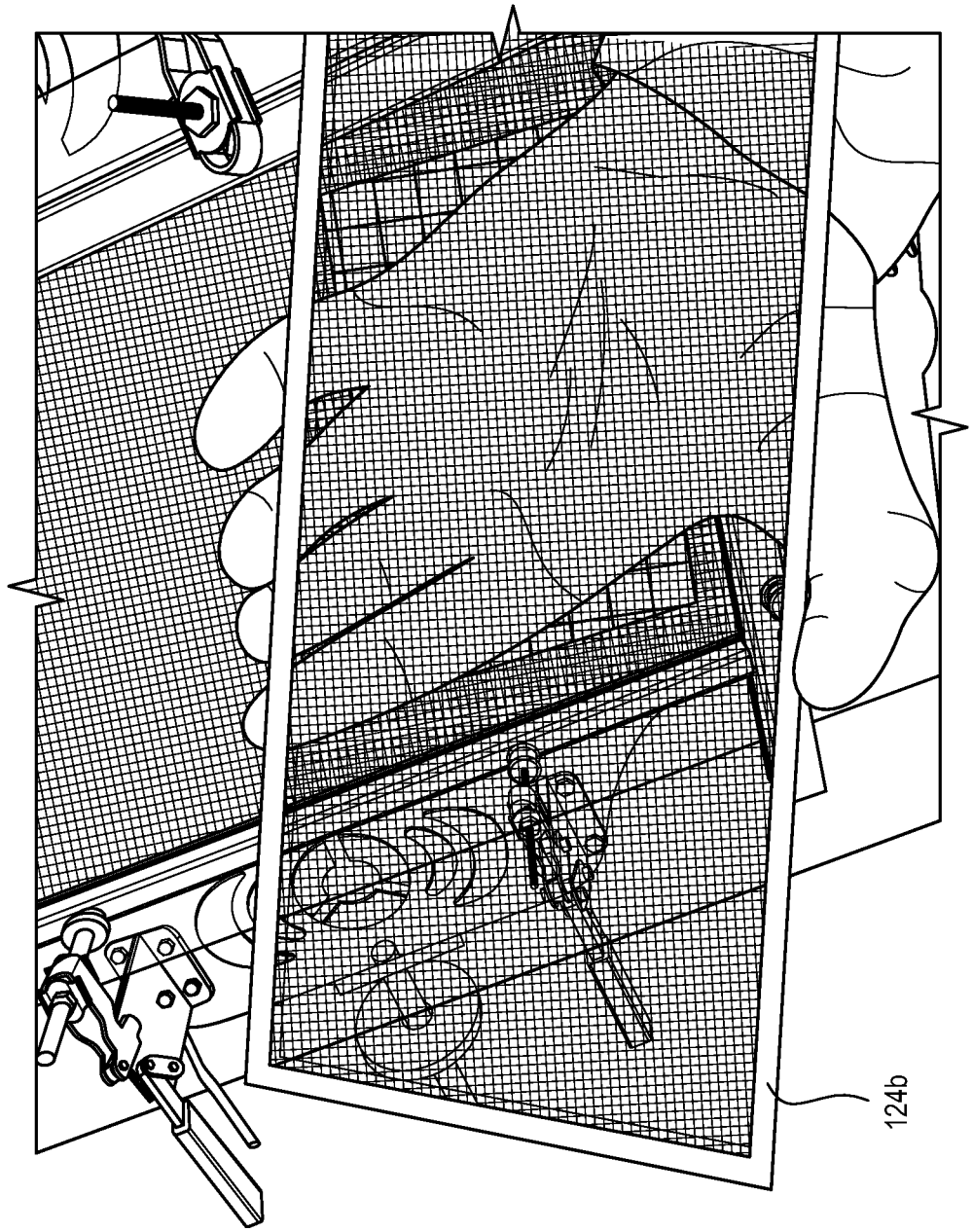
Figure 51:
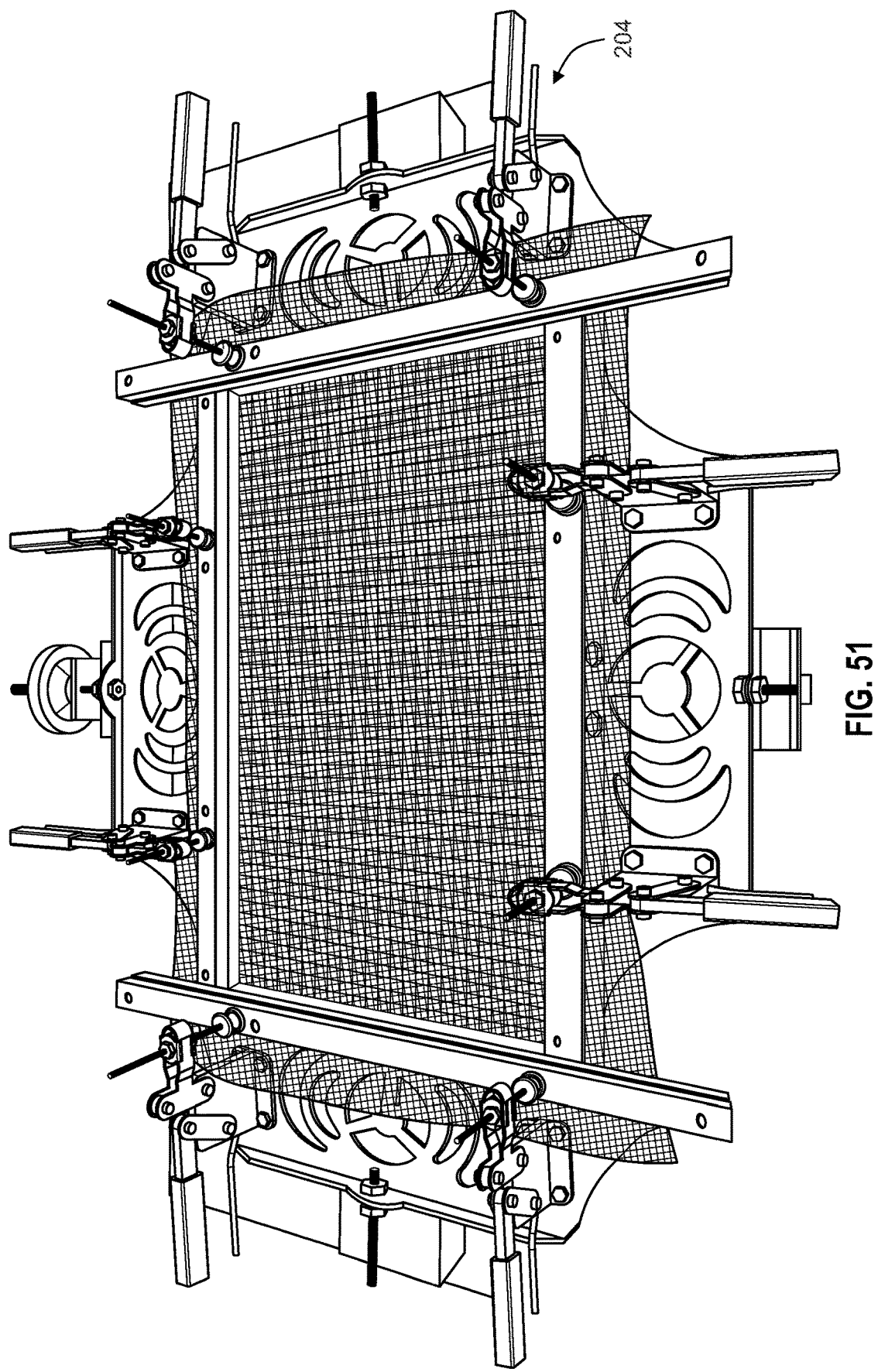
FIG. 51 is a diagrammatic perspective view of an example precursor sheet of primary RF-shielding material being subjected to in-plane tensile loading by a shielding stretching device, such as a conventional silk screen panel stretcher.

At block 236, and referring to FIGS. 21, 22 and 50, the secondary shielding adhesion strip 124b may be wrapped around the secondary peripheral edge 120b and onto the secondary outboard face 118b.

At block 238, and referring to FIGS. 23-26, 64 and 65, the primary panel element 110 may be secured to the secondary panel element 112 such that the primary RF shield layer 128a, the secondary RF shield layer 128b and the protective layer 132 are collectively disposed between the primary backing substrate 114a and the secondary backing substrate 114b. As a result of this step of securing (or potentially by other means), the primary RF shield layer 128a and the secondary RF shield layer 128b may be in electrically-conductive communication with one another. Moreover, this electrically-conductive communication may preferably be by way of the protective adhesion strip 136.

At block 240, and referring to FIGS. 24-26 and 66-68, after the step of securing, a panel joining strip 138 may be applied in adhesive communication with the protective adhesion strip 136 and the secondary RF shield layer 128b, thereby facilitating securement of the first panel element 110 to the second panel element 112, and placing the panel joining strip 138 into electrically-conductive communication with the primary RF shield layer 128a and secondary RF shield layer 128b.

RF Shielding Materials

In certain preferred embodiments of the window apparatus, two RF shielding materials may be used to achieve higher clarity and high RF attenuation.

The first material could be a copper mesh with areal density of 60-80 g/m2 and open area percentage of 80-90%. In other embodiments, the copper mesh may have a higher or lower areal density, and open area percentage, or may not necessarily be copper-based.

The second material may be a nickel copper mesh, with any metal ratio that accomplishes a high level of RF shielding, with areal density of 20-50 g/m2, and thickness between 0.06 and 0.1 mm. In other embodiments, the copper/nickel mesh may have a higher or lower areal density, may be thinner or thicker, or may not necessarily be copper/nickel-based.

In alternate embodiments, three or more layers of RF shielding material may be used, or layers that do not necessarily keep to the same specifications as those stated in the preferred embodiment. For example, two layers of copper mesh may be used, or two layers of nickel/copper mesh, or a nickel/copper mesh with a higher open area percentage with a copper mesh of a lower open area percentage. In alternate embodiments another RF shielding material may be used, such as carbon nano-fiber, silver, aluminum, or others.

Challenges to Maintaining High Clarity Through Continued Usage of the Apparatus

In the desired application of the disclosed apparatus, maintaining high clarity may be important. Aside from the importance of the RF shielding materials used, certain characteristics of the materials, which may be primarily flexible, may introduce challenges to the goal of high clarity. Typical issues with achieving high clarity may include waviness of the materials, creases, punctures, imperfections, etc. To overcome these issues, it may be important to ensure that the RF shielding materials become completely flat and blemish free, and most importantly, maintain that state permanently throughout usage of the product.

In the past this may be difficult to achieve. Prior art and products in the market may not only offer lower clarity, but also may exhibit unstable window conditions where prolonged usage of the product can generate waviness, imperfections, and blemishes. A particular challenge to the practical usage of an RF shielded window might also be the thickness of the overall constructed window. Impractical prior art and products might present an RF shielded window with overall thickness that could require special mounting hardware and processes, and simply may be impractical when using with an RF enclosure such as is mentioned in this disclosure. The disclosed invention and manufacturing method of same may overcome the challenges of thickness of the overall constructed window, as well as maintaining high clarity and low blemishes through continued usage of the apparatus.

Other Materials that May be Used to Construct the Apparatus, and Perform Manufacturing Method In the preferred embodiment, RF shielding materials may be combined with other materials, as described below.

Copper Panel (Copper Mesh+Polycarbonate+Screen Protector)

In a preferred embodiment, the copper mesh material may be "mounted" to a backing material that can allow it to become flat and maintain that state throughout usage of the product. The "backing material" (which may be otherwise referred to herein as a "backing substrate") for this RF shielding material may be clear, such as polycarbonate, but may not necessarily need to maintain a high level of rigidity. In the preferred embodiment, the thickness of the polycarbonate material may be between $1/16"$ and $1/8."$ To initially flatten the copper mesh and reduce visible imperfections, the copper mesh may first be stretched on a device, such as a silk screen panel stretcher. Conductive two-sided adhesive may be placed around the edges of the polycarbonate backing material, partly on the material and partly hanging off of the edge. This border may create an adhesive outer "frame" for the copper mesh to adhere to, but not within the inner visible portion of the window. The additional adhesive that hangs off the edge of the frame may provide an extra portion of copper mesh that could be "wrapped" around the edge of the backing material to provide more adhesive surface area, thereby decreasing the ability of the copper mesh to become undone from the adhesive and allowing for wrinkles or blemishes.

Even still, another material may be required to keep the copper mesh stretched over time throughout continued usage of the product. This material may be referred to herein as a "protective layer," which in some cases may be a screen protector commonly used for protecting phone/tablet screens during usage. A screen protector may provide high clarity while also just enough adhesive to keep the copper mesh from becoming wrinkled, but not so much adhesive that clarity is affected. The adhesive on the screen protector may hold the copper mesh in place, and may also push through the open areas to adhere to the backing material, even further holding the copper mesh in place. Other types of adhesives, such as optically clear liquid adhesive, may still reduce clarity, may introduce bubbles, or may incur increased costs/challenges during manufacturing. In the preferred embodiment, the application of the screen protector material may be simple, easier to deploy in manufacturing, and cheaper to purchase, thereby becoming a very desirable element of the overall construction of the disclosed RF shielded window.

In alternate embodiments, the backing material may not be polycarbonate, but may be another material that offers clarify and a certain level of rigidity, such as glass. It may not be within the range of thickness mentioned, but instead may be thicker or thinner. A screen protector may not necessarily be used to keep the RF shielding layer in place and to reduce waves or blemishes, but instead another material could be used such as optically clear double sided adhesive, liquid adhesive, or not at all. In alternate embodiments the RF shielding material may be pressed between multiple layers of a backing material, or even may be embedded in another material, such as being embedded in a sheet of polycarbonate during the polycarbonate manufacturing process.

Copper/Nickel Panel (Copper/Nickel Mesh+Polycarbonate)

In certain preferred embodiments, the copper/nickel mesh material may be "mounted" to a backing material that can allow it to become flat and maintain that state throughout usage of the product. The "backing material" for this RF shielding material may be clear, such as polycarbonate, and may need to maintain a high level of rigidity. In the preferred embodiment, the thickness of the polycarbonate material may be between $1/4"$ and $1/2"$. To initially flatten the copper/nickel mesh and reduce visible imperfections, the material may first be stretched on a device, such as a silk screen panel stretcher. Conductive two-sided adhesive may be placed around the edges of the polycarbonate backing material, partly on the material and partly hanging off of the edge. This border may create an adhesive outer "frame" for the copper/nickel mesh to adhere to, but not within the inner visible portion of the window. The additional adhesive that hangs off the edge of the frame may provide an extra portion of copper/nickel mesh that could be "wrapped" around the edge of the backing material to provide more adhesive surface area, thereby decreasing the ability of the copper/nickel mesh to become undone from the adhesive and allowing for wrinkles or blemishes.

In alternate embodiments, the backing material may not be polycarbonate, but may be another material that offers clarify and a certain level of rigidity, such as glass. It may not be within the range of thickness mentioned, but instead may be thicker or thinner. In alternate embodiments the RF shielding material may be pressed between multiple layers of a backing material, or even may be embedded in another material, such as being embedded in a sheet of polycarbonate during the polycarbonate manufacturing process.

Combine RF Shielding Layers into Assembled Window

In certain preferred embodiments, two separate "panels" (which may be referred to herein as "panel elements") may be created from two separate RF shielding materials, when combined with their backing materials and screen protector. These panels may then be combined together to assemble into a single unit. Double sided conductive adhesive may be placed on top of the screen protector that is positioned onto the Copper panel, around the border edges. This adhesive can be used to join the two panels together and hold them tightly. The Copper/nickel panel can be positioned with RF shielding material inside and polycarbonate material facing outside, against the Copper panel, also with RF shielding material inside and polycarbonate facing outside, and joined together. In this configuration, the innermost layers could be the screen protector from the Copper panel as well as the double-sided adhesive border joining both panels. When the screen protector is positioned between the RF shielding layers, it can provide protection of each of the RF shielding layers, as well as a thin layer of decoupling that can increase the level of RF shielding capability of the full final window assembly. To further ensure that the panels can be joined permanently into a single RF shielded window unit, and to ensure that conductivity is maintained between both RF shielding layers, conductive tape can be wrapped around the edges of the assembled unit, joining the RF shielding materials in both panels together conductively.

The assembled window unit can then be installed into a metal frame that compresses all outer border edges of the window unit, using mechanical fasteners, such as threaded posts and nuts, at regular intervals. This metal frame can be part of the installation of an RF shielded enclosure, allowing the window to join the conductivity of the enclosure, or may be separate to provide for a rigid structure that can be integrated into other RF enclosures. For example, this metal frame may provide the outermost assembly component for this assembled window to be sold separately for integration into customer applications, such as shielded rooms or cabinets.

In alternate embodiments there may not only be two panels, but may instead be three or more, with different or similar RF shielding materials and/or backing materials. For example, two panels copper/nickel mesh as well as a panel of copper mesh may be combined together. The panels may not actually be panels at all, but may instead be round, convex, flexible, or any other configuration or shape. For example, RF shielding materials may be combined with backing materials to create a convex RF shielded window that allows for various advantages for the user. When the panels or other materials are combined together, alternate embodiments may employ a different material than double sided adhesive to bind them together, or may use no adhesive at all. For example, they layers may simply be combined together and they may still offer roughly the same RF shielding as well as durability characteristics. They may be mechanically bound together using screws that sink directly into the backing material, or may be integrated into a final assembly that does not require adhesive or mechanical fasteners. The screen protector mentioned in the preferred embodiment may not necessarily exist between the RF shielding layers, and the RF shielding layers may instead be positioned against each other. The final assembly may not necessarily require an outer metal frame, but may instead exist without frame, or may use another material other than metal, such as plastic. The outer frame may not have regularly spaced mechanical fasteners to compress the panels, but may instead have a continuous edge or no edges at all.

Notably, the distance between both shielding layers may be an important factor in the shielding. The RF shield layers should not be too far apart, or RF waves can pass through the layers more easily. They are close together to achieve a particular attenuation at particular frequencies. Preferably however, they are slightly decoupled by the thickness of the protective layer. This should enhance the attenuation by creating redundancy (vs. the RF shield layers joining together to effectively become one single shielding layer).

The following listing matches certain terminology used within this disclosure with corresponding reference numbers used in the non-limiting examples illustrated in the several figures.

- 100 RF-shielded window apparatus
- 102 RF-shielded enclosure (e.g., box, room, lab or tent comprising an RF-shielded window apparatus)
- 104 electronic device (e.g., cell phone, tablet or laptop housed within the RF-shielded enclosure)
- 106 ambient environment
- 108 viewpoint
- 110 panel element (e.g., primary panel element)
- 112 panel element (e.g., secondary panel element)
- 114a primary backing substrate (e.g., polycarbonate; e.g., 1/16-1/8 inches thick)
- 114b secondary backing substrate (e.g., polycarbonate; e.g., 1/4-1/2 inches thick)
- 116a primary inboard face (of primary backing substrate)
- 116b secondary inboard face (of secondary backing substrate)
- 118a primary outboard face (of primary backing substrate)
- 118b secondary outboard face (of secondary backing substrate)
- 120a primary peripheral edge (of primary backing substrate)
- 120b secondary peripheral edge (of secondary backing substrate)
- 122a thickness (of primary backing substrate; e.g., 1/16-1/8 inches)
- 122b thickness (of secondary backing substrate; e.g., 1/4-1/2 inches)
- 124a primary shielding adhesion strip (e.g., segments of electrically conductive two-sided adhesive tape)
- 124b secondary shielding adhesion strip (e.g., segments of electrically conductive two-sided adhesive tape)
- 126 outer peel layer (of shielding adhesion strip)
- 128a primary RF shield layer (e.g., copper mesh, nickel-copper mesh or the like)
- 128b secondary RF shield layer (e.g., copper mesh, nickel-copper mesh or the like)
- 130 tension direction (in-plane tensile loading)
- 132 protective layer (e.g., screen protector; e.g., polyethylene terephthalate (PET), thermoplastic polyurethane (TPU), or laminated tempered glass)
- 134 protective outer peel layer
- 136 protective adhesion strip (e.g., segments of electrically-conductive adhesive tape)
- 138 panel joining strip (e.g., segments of electrically-conductive adhesive tape)
- 140 light transmission axis (of RF-shielded window apparatus)
- 142a primary panel axis
- 142b secondary panel axis
- 144a primary shield periphery
- 144b secondary shield periphery
- 146 thickness of protective layer
- 148a primary shield filament
- 148b secondary shield filament
- 150a primary shield void (i.e., spacing between filaments)
- 150b secondary shield void (i.e., spacing between filaments)
- 152 protective inboard face (of protective layer)
- 154 protective outboard face (of protective layer)
- 156 light transmission zone
- 158a primary adhesion edge
- 158b secondary adhesion edge
- 200 method of manufacturing an RF-shielded window apparatus
- 202a precursor sheet of primary RF shielding material (e.g., electrically-conductive mesh)
- 202b precursor sheet of secondary RF shielding material (e.g., electrically-conductive mesh)

204 shielding stretching device (e.g., silk screen panel stretcher)
206 cutting device (e.g., blade)
208 squeegee
210-240 example steps of certain implementations of method 200
300 template guide lines (for placement of adhesion strips)
302 template tool While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An RF-shielded window apparatus comprising:
   a primary panel element including
   (i) a primary backing substrate having a primary peripheral edge defined thereabout, a primary inboard face and a primary outboard face;
   (ii) a primary shielding adhesion strip extending along the primary peripheral edge and being in adhesive communication with the primary inboard face and primary outboard face;
   (iii) a protective layer having a protective inboard face and a protective outboard face;
   (iv) a primary RF shield layer having a primary shield periphery and being disposed between the primary backing substrate and the protective layer; and
   (v) a protective adhesion strip extending along the primary peripheral edge and being in adhesive communication with the protective outboard face and the primary shield periphery.

2. The RF-shielded window apparatus as defined in claim 1 further comprising
   a secondary panel element including
   (i) a secondary backing substrate having a secondary peripheral edge defined thereabout, a secondary inboard face and a secondary outboard face;
   (ii) a secondary shielding adhesion strip extending along the secondary peripheral edge and being in adhesive communication with the secondary inboard face and secondary outboard face; and
   (iii) a secondary RF shield layer having a secondary shield periphery and being disposed across the secondary inboard face.

3. The RF-shielded window apparatus as defined in claim 2 wherein the first panel element and the second panel element are secured to one another such that the primary RF shield layer, the secondary RF shield layer and the protective layer are collectively disposed between the primary backing substrate and the secondary backing substrate.

4. The RF-shielded window apparatus as defined in claim 3 wherein the primary RF shield layer and the secondary RF shield layer are electrically-conductive communication with one another.

5. The RF-shielded window apparatus as defined in claim 4 wherein the electrically-conductive communication is by way of the protective adhesion strip.

6. The RF-shielded window apparatus as defined in claim 5 further comprising a panel joining strip facilitating the securement of the first panel element to the second panel element, the electrically-conductive communication being at least in part by way of the panel joining strip.

7. The RF-shielded window apparatus as defined in claim 3 wherein:
   (i) the primary RF shield layer is comprised of a metallic mesh of interconnected primary shield filaments defining primary shield voids therebetween; and
   (ii) the secondary RF shield layer is comprised a metallic mesh of interconnected secondary shield filaments defining secondary shield voids therebetween;
   wherein the primary shield voids are larger than the secondary shield voids.

8. The RF-shielded window apparatus as defined in claim 3 wherein:
   (i) the primary RF shield layer is comprised of a metallic mesh of interconnected primary shield filaments defining primary shield voids therebetween; and
   (ii) the secondary RF shield layer is comprised a metallic mesh of interconnected secondary shield filaments defining secondary shield voids therebetween;
   wherein the primary shield voids are smaller than the secondary shield voids.

9. The RF-shielded window apparatus as defined in claim 3 wherein:
   (i) the primary RF shield layer is comprised of copper; and
   (ii) the secondary RF shield layer is comprised a copper and nickel.

10. The RF-shielded window apparatus as defined in claim 3 wherein:
    (i) the primary backing substrate has a thickness of between $\frac{1}{16}$ to $\frac{1}{8}$ inches; and
    (ii) the secondary backing substrate has a thickness of between $\frac{1}{4}$ to $\frac{1}{2}$ inches.

11. The RF-shielded window apparatus as defined in claim 3 wherein the RF-shielded window apparatus includes a light transmission zone within which visible light can pass through the entirely RF-shielded window apparatus along a light transition axis.

12. The RF-shielded window apparatus as defined in claim 11 having a visible transmittance of at least 70% within the light transmission zone.

13. A method of manufacturing an RF-shielded window apparatus, the method comprising:
    forming a primary panel element by way of
    providing a primary backing substrate, a primary shielding adhesion strip, a protective layer, and a protective adhesion strip, wherein
    (i) the primary backing substrate has a primary peripheral edge defined thereabout, a primary inboard face and a primary outboard face, and
    (ii) the protective layer has a protective inboard face and a protective outboard face;
    placing the primary shielding adhesion strip in adhesive communication with the primary inboard face and extending partly outward of the primary peripheral edge, thereby defining a primary adhesion edge outward of the primary peripheral edge;
    positioning the primary shielding adhesion strip in adhesive communication with a precursor sheet of primary RF shielding material while the precursor sheet of primary RF shielding is subject to an in-plane tensile loading;
    trimming the precursor sheet of primary RF shielding to terminate at the primary adhesion edge, thereby defining a primary RF shield layer adhered to the primary inboard face by way of the primary shielding adhesion strip, the primary RF shield layer having a primary shield periphery;

applying the protective layer onto the primary RF shield layer;

wrapping the primary shielding adhesion strip around the primary peripheral edge and onto the primary outboard face; and affixing the protective adhesion strip to the protective outboard face and wrapping the protective adhesion strip around the primary peripheral edge, whereby the protective adhesion strip is retained in electrically-conductive communication with the primary RF shield layer.

14. The method as defined in claim 13 further comprising: forming a secondary panel element by way of providing a secondary backing substrate and a secondary shielding adhesion strip, wherein the secondary backing substrate has a secondary peripheral edge defined thereabout, a secondary inboard face and a secondary outboard face;

placing the secondary shielding adhesion strip in adhesive communication with the secondary inboard face and extending partly outward of the secondary peripheral edge, thereby defining a secondary adhesion edge outward of the secondary peripheral edge;

positioning the secondary shielding adhesion strip in adhesive communication with a precursor sheet of secondary RF shielding material while the precursor sheet of secondary RF shielding is subject to an in-plane tensile loading;

trimming the precursor sheet of secondary RF shielding to terminate at the secondary adhesion edge, thereby defining a secondary RF shield layer adhered to the secondary inboard face by way of the secondary shielding adhesion strip, the secondary RF shield layer having a secondary shield periphery; and wrapping the secondary shielding adhesion strip around the secondary peripheral edge and onto the secondary outboard face.

15. The method as defined in claim 14 further comprising: securing the primary panel element to the secondary panel element such that the primary RF shield layer, the secondary RF shield layer and the protective layer are collectively disposed between the primary backing substrate and the secondary backing substrate.

16. The method as defined in claim 15 wherein as a result of the step of securing, the primary RF shield layer and the secondary RF shield layer are electrically-conductive communication with one another.

17. The method as defined in claim 16 wherein the electrically-conductive communication is by way of the protective adhesion strip.

18. The method as defined in claim 17 further comprising after the step of securing, applying a panel joining strip in adhesive communication with the protective adhesion strip and the secondary RF shield layer, thereby facilitating securement of the first panel element to the second panel element, and placing the panel joining strip into electrically-conductive communication with the primary RF shield layer and secondary RF shield layer.

* * * * *